United States Patent
Hiramoto et al.

(10) Patent No.: US 9,179,114 B2
(45) Date of Patent: Nov. 3, 2015

(54) SOLID-STATE IMAGE SENSOR

(71) Applicant: Panasonic Intellectual Property Corporation of America, Torrance, CA (US)

(72) Inventors: Masao Hiramoto, Osaka (JP); Toshiya Fujii, Shiga (JP); Tatsuya Nakamura, Osaka (JP); Seiji Nishiwaki, Hyogo (JP); Yusuke Monobe, Kyoto (JP)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 220 days.

(21) Appl. No.: 14/009,477

(22) PCT Filed: Mar. 14, 2013

(86) PCT No.: PCT/JP2013/001728
§ 371 (c)(1),
(2) Date: Oct. 2, 2013

(87) PCT Pub. No.: WO2013/164901
PCT Pub. Date: Nov. 7, 2013

(65) Prior Publication Data
US 2014/0055650 A1 Feb. 27, 2014

(30) Foreign Application Priority Data
May 2, 2012 (JP) ................. 2012-105293

(51) Int. Cl.
*H04N 5/225* (2006.01)
*H04N 9/64* (2006.01)
*H01L 27/146* (2006.01)
(Continued)

(52) U.S. Cl.
CPC .......... *H04N 9/646* (2013.01); *H01L 27/14621* (2013.01); *H01L 27/14625* (2013.01); *H01L 27/14627* (2013.01); *H01L 27/14629* (2013.01); *H04N 9/045* (2013.01)

(58) Field of Classification Search
USPC ................................. 348/294, 340, 308–310
See application file for complete search history.

(56) References Cited

U.S. PATENT DOCUMENTS 7,009,652 B1 * 3/2006 Tanida et al. ................. 348/340
8,208,052 B2 * 6/2012 Hiramoto et al. ............. 348/294
(Continued)

FOREIGN PATENT DOCUMENTS

JP 59-090467 A 5/1984
JP 2000-151933 A 5/2000
(Continued)

OTHER PUBLICATIONS

International Search Report for corresponding International Application No. PCT/JP2013/001728 mailed Apr. 23, 2013.
(Continued)

*Primary Examiner* — Ngoc-Yen Vu
(74) *Attorney, Agent, or Firm* — Renner, Otto, Boisselle & Sklar, LLP

(57) ABSTRACT

This solid-state image sensor includes an array of photosensitive cells and an array of dispersive elements. The photosensitive cell array is comprised of a plurality of unit blocks 40, each including four photosensitive cells 2a, 2b, 2c and 2d. A condensing element 4c is further arranged to cover the photosensitive cells 2a and 2b and condenses incoming light onto the photosensitive cells 2a and 2b.

15 Claims, 12 Drawing Sheets

(51) Int. Cl.
*H04N 9/04* (2006.01)
*H04N 3/14* (2006.01)

(56) References Cited

U.S. PATENT DOCUMENTS

| | | | |
|---|---|---|---|
| 8,289,422 B2 * | 10/2012 | Hiramoto et al. | 348/273 |
| 2002/0005471 A1 | 1/2002 | Suzuki | |
| 2003/0063204 A1 | 4/2003 | Suda | |
| 2005/0161584 A1 | 7/2005 | Tanaka et al. | |
| 2007/0181923 A1 | 8/2007 | Tanaka | |
| 2010/0176473 A1 | 7/2010 | Nishiwaki | |
| 2010/0188537 A1 | 7/2010 | Hiramoto et al. | |
| 2014/0078355 A1 * | 3/2014 | Hiramoto et al. | 348/273 |

FOREIGN PATENT DOCUMENTS

| | | |
|---|---|---|
| JP | 2001-309395 A | 11/2001 |
| JP | 2003-078917 A | 3/2003 |
| JP | 2005-244947 A | 9/2005 |
| JP | 2007-208817 A | 8/2007 |
| JP | 4264465 B | 2/2009 |
| JP | 2011-066097 A | 3/2011 |
| WO | WO 2009/019818 A1 | 2/2009 |
| WO | WO 2009/153937 A1 | 12/2009 |

OTHER PUBLICATIONS

Form PCT/ISA/237 for corresponding International Application No. PCT/JP2013/001728 dated Apr. 23, 2013 and partial English translation.

* cited by examiner (PHOTOSENSING SECTION)   (PHOTOSENSING SECTION)

SOLID-STATE IMAGE SENSOR

TECHNICAL FIELD

The present application relates to a technique for increasing the sensitivity of a solid-state image sensor and realizing color representation.

BACKGROUND ART

Recently, the performance and functionality of digital cameras and digital movie cameras that use some solid-state image sensor such as a CCD and a CMOS (which will be simply referred to herein as an "image sensor") have been enhanced to an astonishing degree. In particular, the size of a pixel structure for use in an image sensor has been further reduced these days thanks to rapid development of semiconductor device processing technologies, thus getting an even greater number of pixels and drivers integrated together in an image sensor. And the performance of image sensors has been further enhanced as well. Meanwhile, cameras that use a backside illumination type image sensor, which receives incoming light on its back surface side, not on its principal surface side with a wiring layer for the solid-state image sensor, have been developed just recently and their property has attracted a lot of attention these days. Nevertheless, the greater the number of pixels in an image sensor, the lower the intensity of the light falling on a single pixel and the lower the sensitivity of camera tends to be.

The sensitivity of cameras has dropped recently due to not only such a significant increase in resolution but also the use of a color-separating color filter itself. In an ordinary color camera, a subtractive color filter that uses an organic pigment as a dye is arranged to face each photosensitive cell of an image sensor. A color filter transmits one color component of incoming light to use but absorbs the other components of the light. That is why with such a color filter, the optical efficiency of a camera would decrease. Specifically, in a color camera that uses a Bayer color filter arrangement in which color filters in three colors are arranged using a combination of one red (R) pixel, two green (G) pixels and one blue (B) pixel as a fundamental unit, the R color filter transmits an R ray but absorbs G and B rays, the G color filter transmits a G ray but absorbs R and B rays, and the B color filter transmits a B ray but absorbs R and G rays. Consequently, the sum of the quantities of light that can be used by a color camera with the Bayer arrangement is approximately only one-third of the entire incoming light.

To overcome such a decreased sensitivity problem, Patent Document No. 1 discloses a technique for increasing the quantity of the light received by attaching an array of micro lenses to a photodetector section of an image sensor so that a greater percentage of the incoming light can be used. According to this technique, the incoming light is condensed onto photosensitive cells with those micro lenses, thereby substantially increasing the optical aperture ratio of the image sensor. And this technique is now used in almost all solid-state image sensors. It is true that the aperture ratio can be increased substantially by this technique but the decrease in optical efficiency by color filters still persists.

Thus, to avoid the decrease in optical efficiency and the decrease in sensitivity at the same time, Patent Document No. 2 discloses a technique for taking in as much incoming light as possible by using multilayer color filters (as dichroic mirrors) and micro lenses in combination. Such a technique uses a combination of dichroic mirrors, each of which does not absorb light but selectively transmits only a component of light falling within a particular wavelength range and reflects the rest of the light falling within the other wavelength ranges. As a result, only a required component of the incoming light falling within a particular wavelength range can be incident on each photosensing section with causing a significant loss of the incoming light.

FIG. 10 schematically illustrates a cross section of the image sensor of Patent Document No. 2 as viewed on a plane that intersects with its imaging area at right angles. This image sensor includes two condensing micro lenses 4a and 4b, which are respectively arranged on the surface and inside of the image sensor, an opaque member 20, photosensitive cells 2a, 2b, and 2c, and dichroic mirrors 17, 18 and 19, which are arranged so as to face photosensitive cells 2a, 2b and 2c, respectively. The dichroic mirror 17 has such a property as to transmit an R ray and reflect G and B rays. The dichroic mirror 18 has such a property as to reflect a G ray and transmit R and B rays. And the dichroic mirror 19 has such a property as to reflect a B ray and transmit R and G rays.

The light that has impinged on the micro lens 4a has its luminous flux adjusted by the micro lens 4b, and then enters the first dichroic mirror 17, which transmits an R ray but reflects G and B rays. The light ray that has been transmitted through the first dichroic mirror 17 is then incident on the photosensitive cell 2a. On the other hand, the G and B rays that have been reflected from the first dichroic mirror 17 enter the second dichroic mirror 18 adjacent to the first dichroic mirror 17. The second dichroic mirror 18 reflects the G ray of the incoming light and transmits its B ray. The G ray that has been reflected from the second dichroic mirror 18 is incident on the photosensitive cell 2b. On the other hand, the B ray that has been transmitted through the second dichroic mirror 18 is reflected from the third dichroic mirror 19 and then incident on the photosensitive cell 2c that is located right under the dichroic mirror 19. In this manner, in the image sensor disclosed in Patent Document No. 2, the visible radiation that has impinged on the condensing micro lens 4a is not absorbed into color filters but their RGB components can be detected by the three photosensitive cells non-wastefully.

Meanwhile, Patent Document No. 3 discloses an image sensor that can minimize the loss of light by using a micro prism. Such an image sensor has a structure in which the incoming light is dispersed by the micro prism into red, green and blue rays to be received by three different photosensitive cells. Even when such an image sensor is used, the optical loss can also be minimized.

According to the techniques disclosed in Patent Documents Nos. 2 and 3, however, the number of photosensitive cells to provide needs to be as many as that of the dichroic mirrors to use or that of the color components to produce by dispersing the incoming light. That is why to detect light rays in the three primary colors of RGB, for example, the number of photosensitive cells to provide should be tripled compared to a situation where conventional color filters are used, which is a problem.

Thus, to overcome such problems with the related art, Patent Document No. 4 discloses a technique for increasing the optical efficiency by using dichroic mirrors and reflected light, although some loss of the incoming light is involved. FIG. 11 is a partial cross-sectional view of an image sensor that adopts such a technique. As shown in FIG. 11, dichroic mirrors 22 and 23 are embedded in a light-transmitting resin 21. Specifically, the dichroic mirror 22 has such a property as to transmit a G ray and reflect R and B rays, while the dichroic mirror 23 has such a property as to transmit an R ray and reflect G and B rays.

Such a structure cannot receive a B ray at its photosensing section but can sense R and G rays entirely under the following principle. First, if an R ray impinges on the dichroic mirrors 22 and 23, the R ray is reflected from the dichroic mirror 22 but transmitted through the dichroic mirror 23. The R ray that has been reflected from the dichroic mirror 22 is also reflected from the interface between the light-transmitting resin 21 and the air, and then strikes the dichroic mirror 23. Then, the R ray is transmitted through the dichroic mirror 23 and then also transmitted through an organic dye filter 25 and a micro lens 26 that transmit the R ray. In this manner, even though only a part of the light is reflected from a metal layer 27, almost all of the R ray that has impinged on the dichroic mirrors 22 and 23 is incident on the photosensing section. On the other hand, if a G ray impinges on the dichroic mirrors 22 and 23, the G ray is transmitted through the dichroic mirror 22 but reflected from the dichroic mirror 23. The G ray that has been reflected from the dichroic mirror 23 is also totally reflected from the interface between the light-transmitting resin 21 and the air, and then strikes the dichroic mirror 22. Then, the G ray is transmitted through the dichroic mirror 22 and then also transmitted through an organic dye filter 24 and a micro lens 26 that transmit the G ray. In this manner, even though only a part of the light is reflected from the metal layer 27, almost all of the G ray that has impinged on the dichroic mirrors 22 and 23 is incident on the photosensing section almost without causing loss.

According to the technique disclosed in Patent Document No. 4, only one of the three color rays of RGB is lost but light rays of the other two colors can be received with almost no loss based on the principle described above. That is why there is no need to provide photosensing sections for all of the three colors of RGB. In this case, comparing such an image sensor to the one that does not use any dichroic mirrors but uses only organic dye filters to realize a color representation, it can be seen that the image capturing sensitivity can be doubled by this technique. This is because the optical efficiency achieved by using only organic dye filters is approximately one-third but the optical efficiency achieved by adopting the technique disclosed in Patent Document No. 4 is approximately two-thirds of the entire incoming light. Nevertheless, even if such a technique is adopted, one out of the three colors should be sacrificed.

Furthermore, Patent Document No. 5 discloses a color representation technique for improving, by providing dispersive elements for photosensitive cells, the optical efficiency without significantly increasing the number of photosensitive cells to use. According to such a technique, each of the dispersive elements provided for the photosensitive cells disperses the incoming light into multiple light rays and makes those light rays incident on the photosensitive cells according to their wavelength ranges. In this case, each of the photosensitive cells receives combined light rays, in which multiple components falling within mutually different wavelength ranges have been superposed one upon the other, from multiple dispersive elements. As a result, a color signal can be generated by performing a signal arithmetic operation on the photoelectrically converted signals supplied from the respective photosensitive cells.

CITATION LIST

Patent Literature

Patent Document No. 1: Japanese Laid-Open Patent Publication No. 59-90467
Patent Document No. 2: Japanese Laid-Open Patent Publication No. 2000-151933
Patent Document No. 3: Japanese Laid-Open Patent Publication No. 2001-309395
Patent Document No. 4: Japanese Laid-Open Patent Publication No. 2003-78917
Patent Document No. 5: PCT International Application Publication No. 2009/153937

SUMMARY OF INVENTION

Technical Problem

To sum up, according to the conventional technologies, if light-absorbing color filters are used, the number of photosensitive cells to provide does not have to be increased significantly but the optical efficiency achieved will be low. Nevertheless, if dichroic mirrors or micro prisms are used as in the techniques disclosed in Patent Document Nos. 2 to 4, then the optical efficiency will be high but the number of photosensitive cells to provide should be increased considerably.

Meanwhile, according to the technique disclosed in Patent Document No. 5, a color image can be certainly obtained with the optical efficiency improved, theoretically speaking. However, according to that technique, the light that strikes the image sensor is supposed to be incident perpendicularly onto its imaging area. Thus, if this technique is applied to an actual camera, oblique light could be produced significantly according to the F stop of the lens. As a result, crosstalk could occur between light rays incident on the respective photosensitive cells and an error could be caused in the color signal components.

Thus, an embodiment of the present invention provides a color image capturing technique that contributes to not only improving the optical efficiency without increasing the number of photosensitive cells to provide significantly but also achieving good color reproducibility even when crosstalk between those light rays incident on respective photosensitive cells increased due to the production of such oblique light rays.

Solution to Problem

To overcome the problem described above, a solid-state image sensor according to an aspect of the present invention includes: a photosensitive cell array in which a plurality of unit blocks, each including first, second, third and fourth photosensitive cells that are arranged in two rows and two columns, are arranged two-dimensionally on an imaging area, wherein in each unit block, the first, second, third and fourth photosensitive cells are arranged at row 1, column 1 position, row 2, column 1 position, row 1, column 2 position, and row 2, column 2 position, respectively; a dispersive element array including a first dispersive element and a second dispersive element which has a different light-dispersing property from the first dispersive element, the first dispersive element being arranged to face at least partially at least one of the first and third photosensitive cells and to split incoming light according to its wavelength in a direction in which the first and third photosensitive cells are arranged, the second dispersive element being arranged to face at least partially at least one of the second and fourth photosensitive cells and to split incoming light according to its wavelength in a direction in which the second and fourth photosensitive cells are arranged; and a plurality of condensing elements, each of which is arranged in an area that covers the first and third photosensitive cells and which is configured to condense light onto the first and third photosensitive cells.

An image capture device according to another embodiment includes: the solid-state image sensor described above; an optical system which produces an image on the imaging area of the solid-state image sensor; and a signal processing section which generates color signals based on first through fourth photoelectrically converted signals supplied from the first through fourth photosensitive cells, respectively.

This general and particular aspect can be implemented as a system, a method, a computer program or a combination thereof.

Advantageous Effects of Invention

According to an aspect of the present invention, a dispersive element that makes an incoming light ray incident on any of multiple different photosensitive cells is used according to its color component. As a result, even if crosstalk between the light rays being incident on respective photosensitive cells increased due to the production of oblique light rays, a color image can also be captured with high optical efficiency and high color reproducibility without significantly increasing the number of photosensitive cells to use.

DESCRIPTION OF EMBODIMENTS

Figure 1:
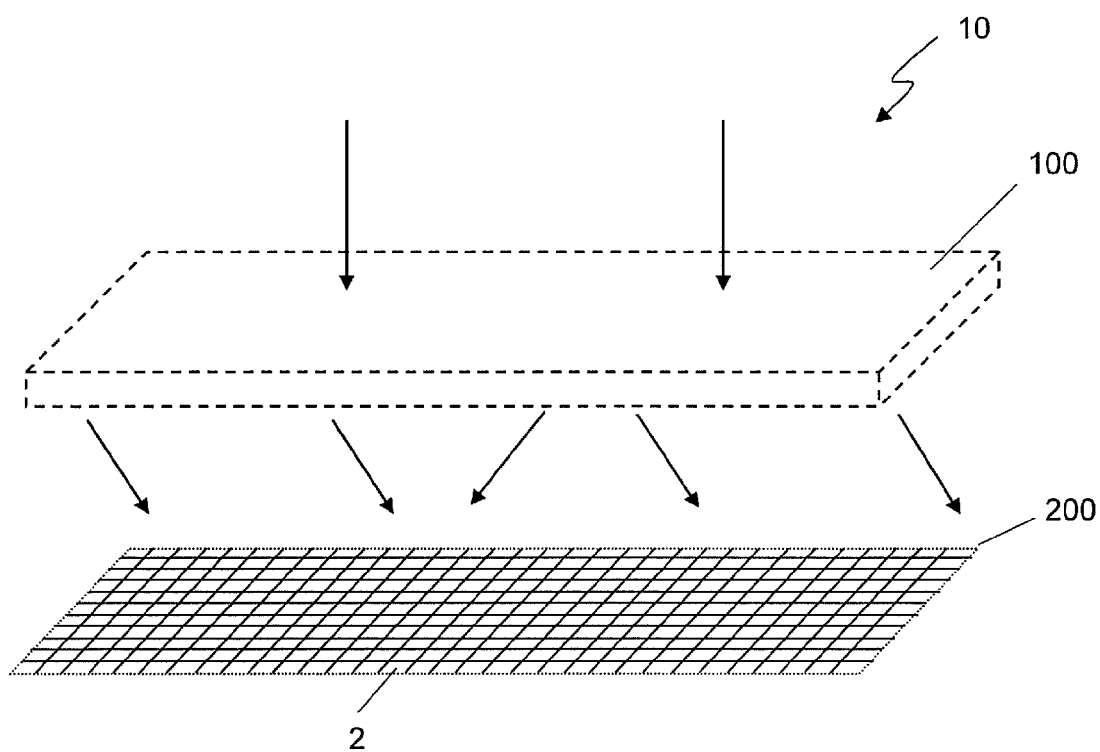
FIG. 1 A perspective view schematically illustrating a relative arrangement of a photosensitive cell array 200 and a dispersive element array 100 in a solid-state image sensor according to an embodiment of the present invention.

Exemplary embodiments of the present invention are outlined as follows:

(1) A solid-state image sensor according to an aspect of the present invention includes: a photosensitive cell array in which a plurality of unit blocks, each including first, second, third and fourth photosensitive cells that are arranged in two rows and two columns, are arranged two-dimensionally on an imaging area, wherein in each unit block, the first, second, third and fourth photosensitive cells are arranged at row 1, column 1 position, row 2, column 1 position, row 1, column 2 position, and row 2, column 2 position, respectively; a dispersive element array including a first dispersive element and a second dispersive element which has a different light-dispersing property from the first dispersive element, the first dispersive element being arranged to face at least partially at least one of the first and third photosensitive cells and to split incoming light according to its wavelength in a direction in which the first and third photosensitive cells are arranged, the second dispersive element being arranged to face at least partially at least one of the second and fourth photosensitive cells and to split incoming light according to its wavelength in a direction in which the second and fourth photosensitive cells are arranged; and a plurality of condensing elements, each of which is arranged in an area that covers the first and third photosensitive cells and which is configured to condense light onto the first and third photosensitive cells.

(2) In one embodiment, the first dispersive element is arranged to face the first or third photosensitive cell and to make light rays falling within mutually different wavelength ranges incident on the first and third photosensitive cells, respectively, and the second dispersive element is arranged to face the second or fourth photosensitive cell and to make light rays falling within mutually different wavelength ranges incident on the second and fourth photosensitive cells, respectively.

(3) In one embodiment of the solid-state image sensor of (2), the first dispersive element makes a light ray falling within a first wavelength range incident on the third photosensitive cell and also makes a complementary color ray of the light ray falling within the first wavelength range incident on the first photosensitive cell, and the second dispersive element makes a light ray falling within a second wavelength range incident on the second photosensitive cell and also makes a complementary color ray of the light ray falling within the second wavelength range incident on the fourth photosensitive cell.

(4) In one embodiment of the solid-state image sensor of (1), the dispersive element array further includes third and fourth dispersive elements, and the first through fourth dispersive elements are arranged to face the first through fourth photosensitive cells, respectively, and configured to make light rays falling within mutually different wavelength ranges incident on the first through fourth photosensitive cells, respectively.

(5) In one embodiment of the solid-state image sensor of (4), the first through fourth dispersive elements have either the property of separating incoming light into a primary color ray and a complementary color ray or the property of dispersing incoming light into light rays falling within three different wavelength ranges.

(6) In one embodiment of the solid-state image sensor of (4) or (5), the first dispersive element makes a light ray falling within a first wavelength range incident on the third photosensitive cell and also makes a complementary color ray of the light ray falling within the first wavelength range incident on the first photosensitive cell, and the third dispersive element makes a light ray falling within a second wavelength range incident on the first photosensitive cell and also makes a complementary color ray of the light ray falling within the second wavelength range incident on the third photosensitive cell.

(7) In one embodiment of the solid-state image sensor of one of (4) to (6), the first dispersive element makes a light ray falling within a first wavelength range incident on the first photosensitive cell and also makes a complementary color ray of the light ray falling within the first wavelength range incident on the third photosensitive cell, and the third dispersive element makes a light ray falling within the first wavelength range incident on the first photosensitive cell and also makes a complementary color ray of the light ray falling within the first wavelength range incident on the third photosensitive cell.

(8) In one embodiment of the solid-state image sensor of one of (5) to (7), the second dispersive element makes a light ray falling within a third wavelength range incident on the fourth photosensitive cell and also makes a complementary color ray of the light ray falling within the third wavelength range incident on the second photosensitive cell, and the fourth dispersive element makes a light ray falling within the third wavelength range incident on the fourth photosensitive cell and also makes a complementary color ray of the light ray falling within the third wavelength range incident on the second photosensitive cell.

(9) In one embodiment of the solid-state image sensor of (8), the first, second and third wavelength ranges are respectively one, another and the other of the colors red, green and blue wavelength ranges.

(10) In one embodiment of the solid-state image sensor of one of (1) to (9), each of the plurality of condensing elements is a cylindrical lens that has a curved surface on its light incident side.

(11) An image capture device according to an aspect of the present invention includes: the solid-state image sensor of one of (1) to (10); an optical system which produces an image on the imaging area of the solid-state image sensor; and a signal processing section which generates color signals based on first through fourth photoelectrically converted signals supplied from the first through fourth photosensitive cells, respectively.

(12) In one embodiment of the image capture device of (11), the signal processing section generates a first luminance signal by performing processing including adding together respective output signals of the first and third photosensitive cells, generates a second luminance signal by performing processing including adding together respective output signals of the second and fourth photosensitive cells, and corrects the color signals based on the difference between the first and second luminance signals.

(13) In one embodiment, the image capture device of (12) further includes a storage medium on which stored is information about a correlation between a coefficient k1 defining a light condensing property of the condensing element, a correction coefficient k2 indicating the rate of decrease in the coefficient k1 due to influence of light obliquely incident on the solid-state image sensor, and a coefficient k3 indicating the degree of deterioration in the light-dispersing property of the first and second dispersive elements due to the influence of the obliquely incident light.

(14) In one embodiment of the image capture device of (13), the signal processing section corrects the color signals based on the difference between the first and second luminance signals, the coefficient k1, and the information about the correlation.

(15) In one embodiment of the image capture device of one of (12) to (14), the signal processing section generates first and second color difference signals by performing signal arithmetic operations on a first differential signal representing the difference between the first and third photoelectrically converted signals and a second differential signal representing the difference between the second and fourth photoelectrically converted signals and corrects the first and second color difference signals based on the difference between the first and second luminance signals.

Hereinafter, embodiments of the present invention will be described specifically.

According to the technique disclosed in Patent Document No. 5, incoming light is supposed to be incident perpendicularly onto the imaging area of an image sensor. That is why if such a technique is actually applied to a camera, color signals generated by signal processing could have errors due to the influence of obliquely incident light. For example, if the image gets blurred more significantly when the f stop is increased, then the subject that should be represented in white could be colored in red. Such phenomenon arises because the larger the aperture of the lens stop, the higher the percentage of the obliquely incident light to the overall incoming light for the image sensor and the more significantly the wavelength range basis intensity distribution of a light ray incident on each photosensitive cell shifts from the intended one.

The present inventors newly found such a problem and discovered that such a problem can be overcome by adopting a different optical system and a different kind of signal processing from the ones disclosed in Patent Document No. 5. Hereinafter, the basic principle of embodiments of the present invention will be described with reference to FIG. 1 and FIGS. 2A through 2H. In the following description, to spatially split incident light into multiple components of light falling within mutually different wavelength ranges or having respectively different color components will be referred to herein as "dispersing of light".

A solid-state image sensor according to an embodiment of the present invention (which will be sometimes simply referred to herein as an "image sensor") includes a photosensitive cell array in which photosensitive cells (pixels) are arranged two-dimensionally on an imaging area and a dispersive element array including a number of dispersive elements. FIG. 1 is a perspective view illustrating schematically respective portions of a photosensitive cell array 200 and a dispersive element array 100, which are stacked in this order on the imaging area of a solid-state image sensor 10. The dispersive element array 100 is arranged so as to face the photosensitive cell array 200 and to receive the incoming light. It should be noted that the photosensitive cells 2 do not have to have such an arrangement, shape or size as the one shown in FIG. 1 but may also have any other known arrangement, shape or size. Also, the dispersive element array 100 is illustrated in FIG. 1 as a quadrangular prism for convenience sake, but actually does not always have such a shape but may have any of various other structures as well.

On receiving incoming light, each photosensitive cell 2 performs photoelectric conversion on the light and outputs an electrical signal representing the intensity (or the quantity) of the light received. Such an electrical signal will be referred to herein as a "photoelectrically converted signal" or a "pixel signal". In this embodiment of the present invention, each photosensitive cell 2 receives multiple light rays that fall within multiple different wavelength ranges (i.e., light rays with multiple different color components) and that have had their traveling direction changed by the dispersive element array 100. As a result, the light actually received by each photosensitive cell 2 has multiple distributions of split light rays (i.e., multiple intensity distributions associated with respective wavelength ranges), which are different from those of the light that would be received were it not for the dispersive elements.

Hereinafter, the basic structure of this image sensor 10 will be described with reference to FIGS. 2A through 2E.

Figure 2A:
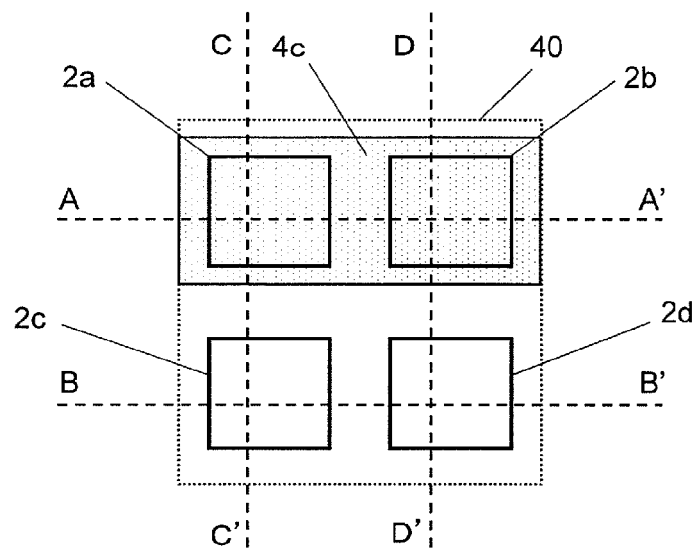
FIG. 2A A plan view illustrating an exemplary unit block of a solid-state image sensor according to an embodiment of the present invention.

FIG. 2A is a plan view illustrating an exemplary basic pixel structure (which will be referred to herein as a "unit block") 40 of the photosensitive cell array 200. The photosensitive cell array 200 has a structure in which a plurality of unit blocks 40, each including four photosensitive cells 2a, 2b, 2c and 2d, are arranged two-dimensionally on an imaging area. In the example illustrated in FIG. 2A, four photosensitive cells are arranged in two columns and two rows in each unit block. Also, in FIG. 2A, the reference numeral 4c denotes a lateral micro lenticular lens which is configured to condense incoming light only vertically. This micro lenticular lens is a cylindrical lens which has a curved surface on its light incident side, and is arranged every other row vertically. In FIG. 2A, the lateral direction will be referred to herein as the "horizontal direction" and the longitudinal direction as the "vertical direction", respectively.

Figure 2B:
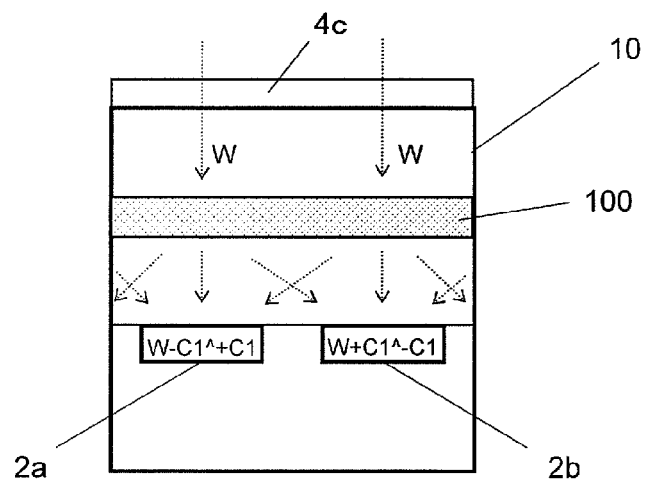
FIG. 2B A cross-sectional view as viewed on the plane A-A' shown in FIG. 2A.
Figure 2C:
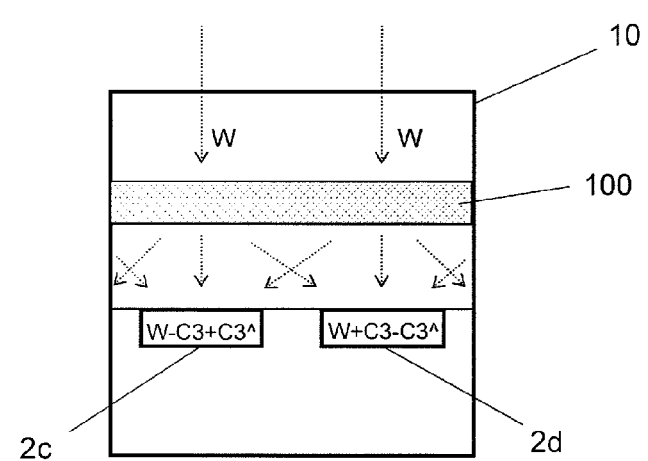
FIG. 2C A cross-sectional view as viewed on the plane B-B' shown in FIG. 2A.

FIGS. 2B and 2C are schematic cross-sectional views as respectively viewed on the planes A-A' and B-B' shown in FIG. 2A. As shown in FIGS. 2B and 2C, each incoming light ray that has entered this image sensor 10 has its traveling direction changed according to its color component while being transmitted through the dispersive element array 100, and therefore, the light rays received by respective photosensitive cells have mutually different split light distributions. In this description, the light that would be directly received by each photosensitive cell were it not for the dispersive element array 100 will be referred to herein as that photosensitive cell's "entering light". If the photosensitive cells 2a through 2d included in each single unit block 40 are located close to each other, then those photosensitive cells' entering light should have almost the same light intensity distribution and substantially the same split light distribution.

Figure 2D:
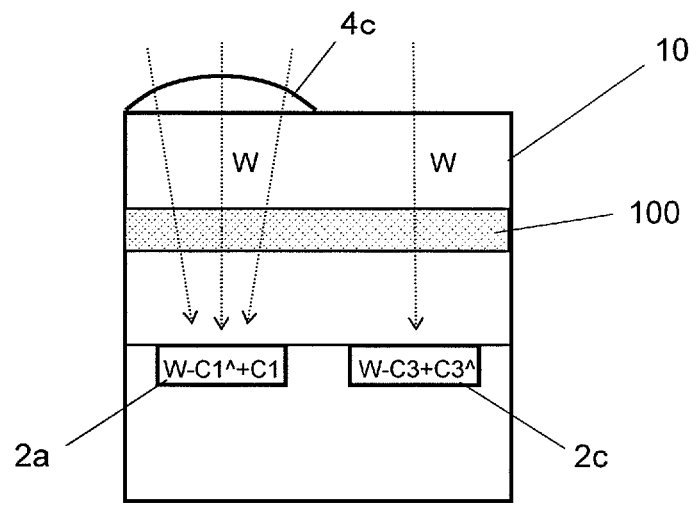
FIG. 2D A cross-sectional view as viewed on the plane C-C' shown in FIG. 2A.
Figure 2E:
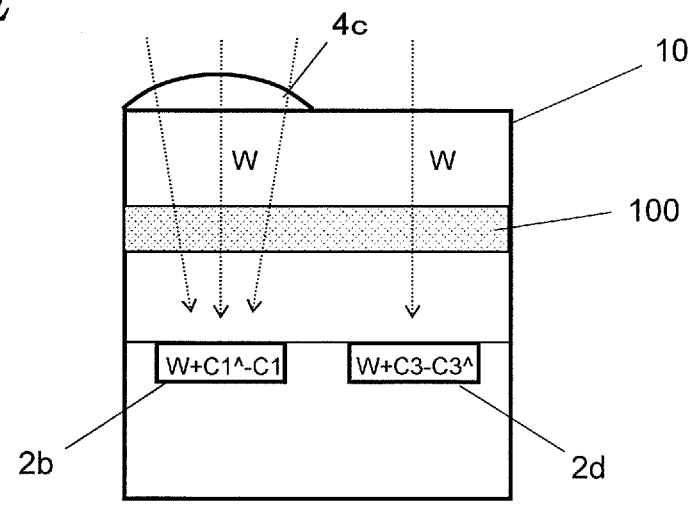
FIG. 2E A cross-sectional view as viewed on the plane D-D' shown in FIG. 2A.

FIGS. 2D and 2E are schematic cross-sectional views as respectively viewed on the planes C-C' and D-D' shown in FIG. 2A. The light that has entered the image sensor 10 is condensed vertically (i.e., laterally in FIG. 2D) by the micro lenticular lens 4c. As far as the vertical direction is concerned, the incoming light does not have its traveling direction changed according to its color component while being transmitted through the dispersive element array 100. Also, the light that has entered an area of this image sensor 10 where the micro lenticular lens 4c is not arranged does not have its traveling direction changed by the dispersive element array 100 but just goes straight on. FIGS. 2D and 2E show how the light is incident in that way. In this case, the micro lenticular lens 4c is designed so as to have a vertical width that is slightly broader than the interval between adjacent photosensitive cells (i.e., the pixel pitch). As a result, compared to a situation where no micro lenticular lens 4c is provided, the quantity of light received by the photosensitive cells 2a and 2b increases but the quantity of light received by the photosensitive cells 2c and 2d decreases.

First of all, the intensities (or quantities) of the light that would be received by the respective photosensitive cells if there were not the micron lenticular lens and if the incoming light were incident perpendicularly onto this image sensor 10. In the following description, the intensity of light will be identified by a sign. Specifically, the intensity of the visible radiation component of each of those photosensitive cells' entering light will be identified herein by the sign "W". In this description, the visible radiation component included in the cell's entering light will be roughly classified into first, second and third color components. That is to say, if the intensities of the first, second and third color components are identified by C1, C2 and C3, respectively, then W=C1+C2+C3.

In the following description, not only the intensities of respective color components but also the color components themselves will be sometimes identified herein by C1, C2 and C3. Also, the rest of visible radiation other than a particular color component will be referred to herein as the "complementary color" of that color component and a light ray representing the complementary color as a "complementary color ray". Then, the complementary color of the first color component C1 is represented by C2+C3, the complementary color of the second color component C2 is represented by C1+C3, and the complementary color of the third color component C3 is represented by C1+C2. In the following description, the complementary color of a color component Cn (where Cn is one of C1, C2 and C3) and its intensity will be sometimes identified herein by Cn^ for convenience sake. A typical combination of the first, second and third color components consists of the three primary colors of red (R), green (G) and blue (B). However, as long as visible radiation can be divided into three light rays falling within mutually different wavelength ranges, any other combination of color components may be adopted as well.

Hereinafter, it will be described based on this supposition how the dispersive element array 100 of this embodiment works. Supposing that there is not the micro lenticular lens 4c and that the light that has entered this image sensor 10 will be incident perpendicularly onto the imaging area, the dispersive element array 100 makes light which is obtained by subtracting the complementary color ray (with an intensity C1^) of the first color component from the first photosensitive cell's (2a)

entering light (with an intensity W) and adding a light ray representing the first color component (with an intensity C1) to the remainder incident on the first photosensitive cell 2a. Also, the dispersive element array 100 makes light which is obtained by subtracting the light ray representing the first color component (with the intensity C1) from the second photosensitive cell's (2b) entering light (with the intensity W) and adding the complementary color ray (with the intensity C1ˆ) of the first color component to the remainder incident on the second photosensitive cell 2b. Furthermore, the dispersive element array 100 makes light which is obtained by subtracting a light ray representing a third color component (with an intensity C3) from the third photosensitive cell's (2c) entering light (with the intensity W) and adding a complementary color ray (with the intensity C3ˆ) of the third color component to the remainder incident on the third photosensitive cell 2c. And the dispersive element array 100 makes light which is obtained by subtracting the complementary color ray (with an intensity C3ˆ) of the third color component from the fourth photosensitive cell's (2d) entering light (with the intensity W) and adding the light ray representing the third color component (with the intensity C3) to the remainder incident on the fourth photosensitive cell 2d. In FIGS. 2B through 2E, the intensities of the light rays received by the photosensitive cells 2a through 2d in this situation are identified by respective signs. The photosensitive cells 2a through 2d are configured to output photoelectrically converted signals (pixel signals) representing the respective quantities of light received. Consequently, by making these signal arithmetic operations, signals representing C1, C2 and C3, i.e., color signals, can be obtained.

Figure 2F:
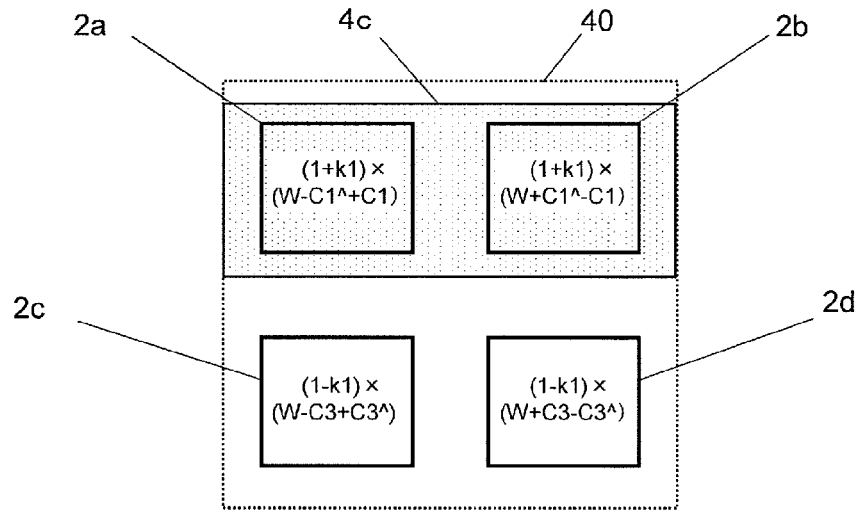
FIG. 2F Shows the respective quantities of light received by the photosensitive cells 2a through 2d when the light condensing effect caused by a micro lenticular lens is taken into account.
Figure 2G:
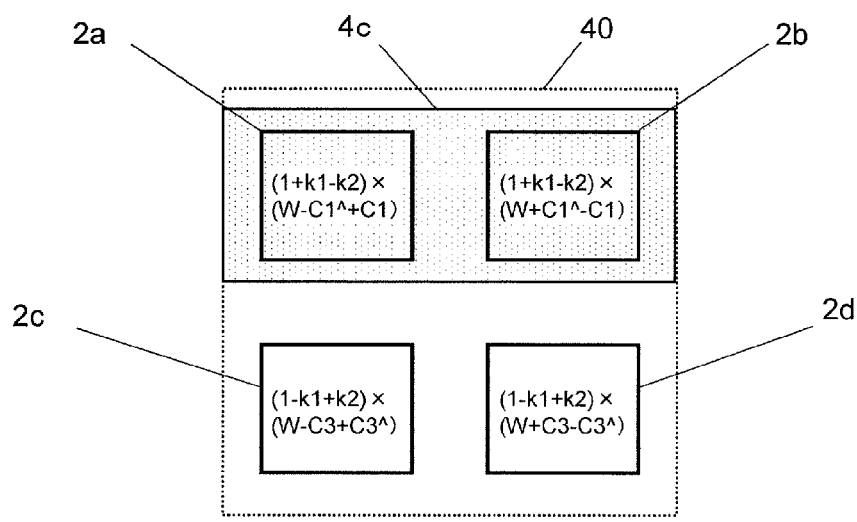
FIG. 2G Shows the respective quantities of light received by the photosensitive cells 2a through 2d when the light condensing effect caused by the micro lenticular lens and the influence of vertical obliquely incident light are taken into account.

However, since the micro lenticular lens 4c is actually arranged, the influence of the micro lenticular lens 4c needs to be taken into consideration. If the micro lenticular lens 4c is provided, the quantity of light incident on the photosensitive cells 2a and 2b increases but the quantity of light incident on the photosensitive cells 2c and 2d decreases compared to a situation where no micro lenticular lens 4c is provided. Supposing the ratio of such a variation in the quantity of the incident light is indicated by k1 (where k1 is a real number that satisfies 0<k1<1), the quantity of the light incident on the photosensitive cells 2a and 2b increases by (1+k1) and the quantity of the light incident on the photosensitive cells 2c and 2d increases by (1-k1). That is to say, considering the entire photosensitive cell array 200, the quantity of the incident light becomes different between a portion where an odd row of pixels are arranged and a portion where an even row of pixels are arranged. FIG. 2F shows the light rays received by the photosensitive cells 2a through 2d in such a situation.

On top of that, the influence of obliquely incident light also needs to be taken into account. If such a light ray has been incident obliquely to the vertical direction, then the difference in the quantity of the incident light caused by the micro lenticular lens 4c will narrow. If the degree of such narrowing is indicated by the sign k2 (where k2 is a real number that satisfies 0<k2<k1), then the quantity of the light incident on the photosensitive cells 2a and 2b increases by (1+k1-k2) and the quantity of the light incident on the photosensitive cells 2c and 2d increases by (1-k1+k2). FIG. 2F shows the light rays received by the photosensitive cells 2a through 2d in such a situation.

Figure 2H:
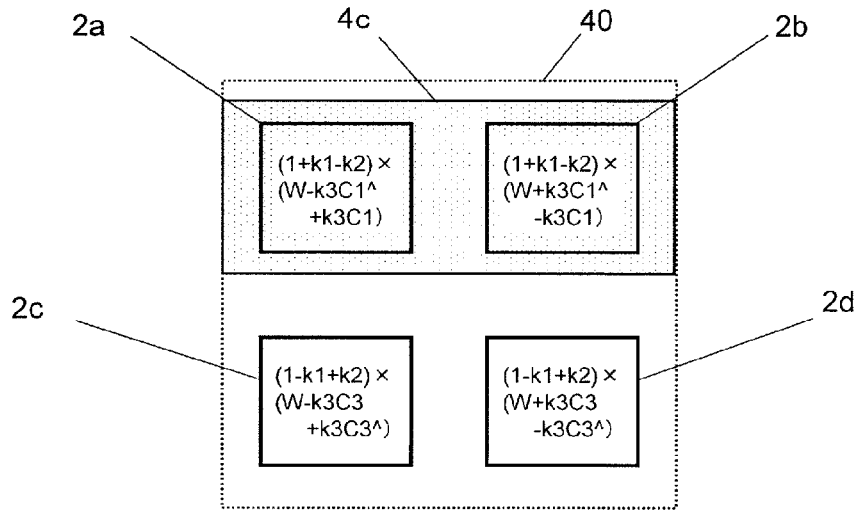
FIG. 2H Shows the respective quantities of light received by the photosensitive cells 2a through 2d when the influence of horizontal obliquely incident light is also taken into account.

Furthermore, even between horizontally adjacent photosensitive cells, the degree of mixture of light increases and the degree of color separation decreases due to the crosstalk produced by the obliquely incident light. That is to say, the dispersive element array 200 can no longer separate the C1 and C1ˆ light rays shown in FIG. 2B and the C3 and C3ˆ light rays shown in FIG. 2C perfectly from each other. As a result, an error is caused between a color signal actually generated and the expected signal. FIG. 2H shows the light rays received by the photosensitive cells 2a through 2d with that influence taken into consideration. In FIG. 2H, k3 is a real number that satisfies 0<k3<1 and is a coefficient indicating the degree of imperfectness of dispersing of light as will be described later.

Now, it will be described how the image sensor with such a configuration performs signal processing of this embodiment with the influence of the micro lenticular lens 4c and the obliquely incident light produced taken into account. First of all, suppose the micro lenticular lens 4c and the obliquely incident light produced affect only an image capturing operation to be performed in the vertical direction. The photosensitive cells 2a and 2b receive light rays, of which the intensities are represented by $(1+k1-k2)(W-C1ˆ+C1)$ and $(1+k1-k2)(W-C1+C1ˆ)$, respectively. On the other hand, the photosensitive cells 2c and 2d receive light rays, of which the intensities are represented by $(1-k1+k2)(W-C3+C3ˆ)$ and $(1-k1+k2)(W-C3ˆ+C3)$, respectively. The respective photosensitive cells output photoelectrically converted signals (pixel signals) representing these intensities. Suppose the photoelectrically converted signals output from the photosensitive cells 2a to 2d will be identified herein by S2a, S2b, S2c and S2d, respectively, and signals representing the intensities W, C1, C2, C3, C1ˆ, C2ˆ and C3ˆ will be identified herein by Ws, C1s, C2s, C3s, C1ˆs (=C2s+C3s), C2ˆs (=C1s+C3s) and C3ˆs (=C1s+C2s), respectively. And Ws=C1s+C2s+C3s is supposed to be satisfied. Then S2a, S2b, S2c and S2d are represented by the following Equations (1) to (4), respectively:

$$S2a = (1 + k1 - k2)(Ws - C1\wedge s + C1s) = 2(1 + k1 - k2)C1s \quad (1)$$

$$S2b = (1 + k1 - k2)(Ws - C1s + C1\wedge s) \quad (2)$$
$$= 2(1 + k1 - k2)C1\wedge s$$

$$S2c = (1 - k1 + k2)(Ws - C3s + C3\wedge s) \quad (3)$$
$$= 2(1 - k1 + k2)C3\wedge s$$

$$S2d = (1 - k1 + k2)(Ws - C3\wedge s + C3s) = 2(1 - k1 + k2)C3s \quad (4)$$

If the difference between the signals S2a and S2b and the difference between the signals S2c and S2d are identified by D1 and D2, respectively, D1 and D2 are given by the following Equations (5) and (6), respectively:

$$D1 = S2a - S2b = 2(1+k1-k2)(C1s-C1\text{'}s) \quad (5)$$

$$D2 = S2d - S2c = 2(1-k1+k2)(C3s-C3\text{'}s) \quad (6)$$

Now, it will be described how the micro lenticular lens 4c and the obliquely incident light produced affect an image capturing operation in the horizontal direction. The micro lenticular lens 4c condenses incoming light only vertically, and therefore, does not affect the operation in the horizontal direction. However, the degree of mixture of light increases and the degree of color separation decreases due to the crosstalk produced by the obliquely incident light. That is to say, the absolute values of D1 and D2 decrease due to that influence. If the degree of that decrease is represented by k3, D1 and D2 can be given by the following Equations (7) and (8), respectively:

$$D1 = k3(S2a-S2b) = 2k3(1+k1-k2)(C1s-C1\text{'}s) \quad (7)$$

$$D2 = k3(S2d-S2c) = 2k3(1-k1+k2)(C3s-C3\text{'}s) \quad (8)$$

In Equations (7) and (8), to multiply each of (S2a−S2b) and (S2d−S2c) by k3 corresponds to multiplying each of C1s, C1ˆs, C3s and C3ˆs in Equations (1) to (4) by k3. That is to say, it means that the following Equations (9) to (12) are used instead of Equations (1) to (4):

$$S2a = (1+k1-k2)(Ws-k3C1\char94 s+k3C1s) \quad (9)$$
$$= (1+k1-k2)\{(1-k3)Ws+2k3C1s\}$$

$$S2b = (1+k1-k2)(Ws-k3C1s+k3C1\char94 s) \quad (10)$$
$$= (1+k1-k2)\{(1-k3)Ws+2k3C1\char94 s\}$$

$$S2c = (1-k1+k2)(Ws-k3C3s+k3C3\char94 s) \quad (11)$$
$$= (1-k1+k2)\{(1-k3)Ws+2k3C3\char94 s\}$$

$$S2d = (1-k1+k2)(Ws-k3C3\char94 s+k3C3s) \quad (12)$$
$$= (1-k1+k2)\{(1-k3)Ws+2k3C3s\}$$

Furthermore, since C1ˆs=Ws−C1s and C3ˆs=Ws−C3s are satisfied, the following Equations (13) and (14) are obtained based on Equations (7) and (8):

$$D1=2k3(1+k1-k2)(2C1-Ws) \quad (13)$$

$$D2=2k3(1-k1+k2)(2C3s-Ws) \quad (14)$$

D1 and D2 represented by these Equations (13) and (14) can be used as color difference signals.

On the other hand, by adding together S2a and S2b, S2c and S2d, or S2a through S2d, a signal, of which the intensity is at most four times as high as the intensity W of the cell's entering light, can be obtained as represented by the following Equations (15) to (17). These signals have been photoelectrically converted with the loss of the incoming light reduced significantly. Particularly if Equation (17) is used to obtain a luminance signal, the sensitivity of the resultant image will be an ideal one.

$$S2a+S2b=2(1+k1-k2)Ws \quad (15)$$

$$S2c+S2d=2(1-k1+k2)Ws \quad (16)$$

$$S2a+S2b+S2c+S2d=4Ws \quad (17)$$

Once the luminance signal is obtained by performing any of the arithmetic operations represented by Equations (15) to (17) and once two color difference signals are obtained by Equations (13) and (14), color signals C1s, C2s and C3s (e.g., RGB signals) can be obtained by performing a matrix operation. That is to say, by performing a signal arithmetic operation on the four photoelectrically converted signals S2a through S2d supplied from the photosensitive cells $2a$ through $2d$, color signals can be calculated.

In this case, the color difference signals D1 and D2 represented by Equations (13) and (14) are affected by the micro lenticular lens $4c$ and the obliquely incident light produced. However, if k1, k2 and k3 are known, then signals which are not affected by them can be obtained conversely. Hereinafter, it will be described how to obtain those coefficients. k1 is a parameter to be determined by the shape and arrangement of the micro lenticular lens $4c$ and can be obtained by optical design. Meanwhile, k2 and k3 are parameters which are both determined by the influence of obliquely incident light, but have a correlation between them because they are both determined by the obliquely incident light. Thus, as for k2, if k1 is already known, the value of k2 can be obtained by substituting the values of the signals S2a through S2d into Equations (15) through (17). As for k3, the correlation between k2 and k3 may be obtained in advance via either experiment or simulation, and the k3 value may be determined based on the k2 value that has been obtained by Equations (15) through (17). Since the quantity of the obliquely incident light depends on the f stop of the optical diaphragm, the correlation between k2 and k3 may be collected to make a database by carrying out experiments for measuring a color variation with the f stop of the optical diaphragm changed. Alternatively, instead of making a database, a function representing the correlation between k2 and k3 may be obtained as well.

The image sensor 10 of this embodiment can not only obtain color information by performing a signal arithmetic operation using dispersive elements without using any color filter that would absorb incoming light partially but also reduce the influence of crosstalk between light rays to be incident on respective photosensitive cells even if the crosstalk increases due to the obliquely incident light produced. As a result, the loss of light can be cut down, the image capturing sensitivity can be increased, and good color reproducibility is realized.

In FIGS. 1, 2B and 2C, the dispersive element array 100 is illustrated as a single continuous member that covers multiple photosensitive cells. However, the dispersive element array 100 may also be a set of spatially separated dispersive elements. Examples of such dispersive elements include a high-refractive-index transparent member and a micro prism as will be described later. Nevertheless, as long as the photoelectrically converted signals represented by Equations (1) to (4) or Equations (9) to (12) are obtained, the dispersive element array 100 of the present disclosure may also have any other arrangement. For example, the incoming light may also be dispersed through a hologram element, for example.

Furthermore, in the example described above, the dispersive element array 100 is supposed to split the incoming light into a C1 ray and a C1ˆ ray that is its complementary color ray as for the first row shown in FIG. 2H and split the incoming light into a C3 ray and a C3ˆ ray that is its complementary color ray as for the second row. However, this is just an example and the incoming light does not always have to be dispersed this way. Rather the dispersive element array 100 just needs to be configured so that the photosensitive cells $2a$ through $2d$ receive light rays with mutually different split light distributions. For example, the dispersive element array 100 may also be configured so that the photosensitive cells $2a$ through $2d$ output the signals S2a through S2d represented by the following Equations (18) through (21), respectively:

$$S2a=(1+k1-k2)(Ws-k3C1s+k3C2s) \quad (18)$$

$$S2b=(1+k1-k2)(Ws-k3C2s+k3C1s) \quad (19)$$

$$S2c=(1-k1+k2)(Ws-k3C3s+k3C3s\char94) \quad (20)$$

$$S2d=(1-k1+k2)(Ws-k3C3s\char94+k3C3s) \quad (21)$$

A specific example in a situation where these signals S2a through S2d are output will be described for the first embodiment to be described below. Hereinafter, specific embodiments will be described with reference to FIGS. 3 through 8. In the following description, any pair of components having the same or substantially the same function will be identified by the same reference numeral.

Embodiment 1

Figure 3:
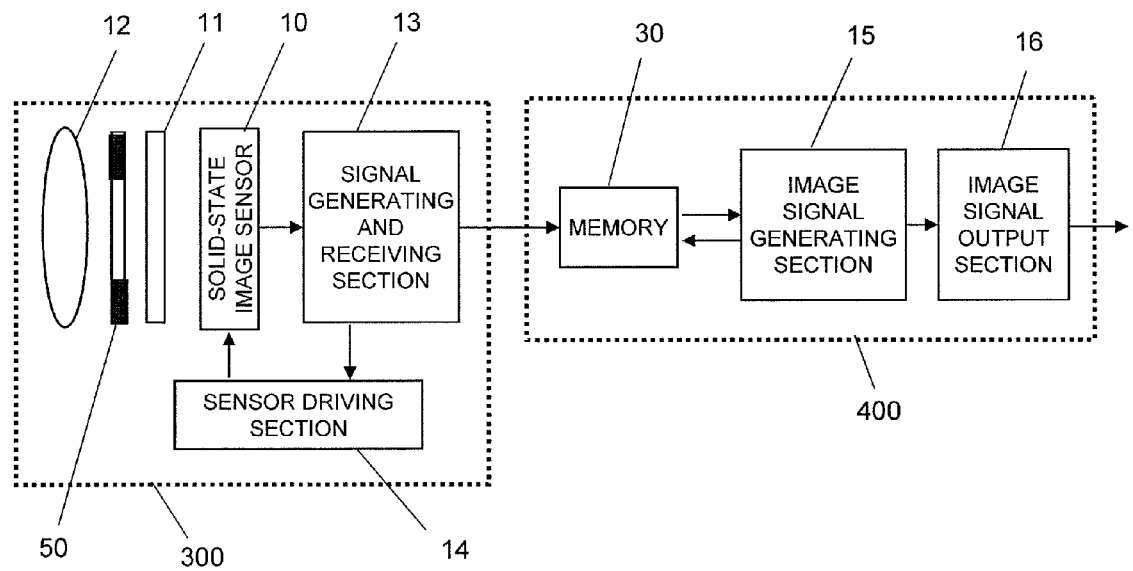
FIG. 3 A block diagram illustrating a general configuration for an image capture device as a first embodiment.

FIG. 3 is a block diagram illustrating an overall configuration for an image capture device as a first embodiment. The image capture device of this embodiment is a digital electronic camera and includes an image capturing section 300 and a signal processing section 400 that receives a signal from the image capturing section 300 and outputs a signal representing an image (i.e., an image signal). The image capture device may either generate only a still picture or have the function of generating a moving picture.

The image capturing section 300 includes an optical lens 12 which images a given subject, an optical diaphragm 50, an optical filter 11, and a solid-state image sensor 10 (which will be simply referred to herein as an "image sensor") which converts the optical information that has been gotten through the optical lens 12 and the optical filter 11 into an electrical signal by photoelectric conversion. The image capturing section 300 further includes a signal generating and receiving section 13 which not only generates a fundamental signal to drive the image sensor 10 but also receives the output signal of the image sensor 10 and sends it to the signal processing section 400 and a sensor driving section 14 which drives the image sensor 10 in accordance with the fundamental signal generated by the signal generating and receiving section 13. The optical lens 12 is a known lens and may be a lens unit including multiple lenses. The optical filters 11 are a combination of a quartz crystal low-pass filter which reduces a moiré pattern to be caused by a pixel arrangement with an infrared cut filter which filters out infrared rays. The image sensor 10 is typically a CMOS or a CCD, and may be fabricated by known semiconductor device processing technologies. The signal generating and receiving section 13 and the sensor driving section 14 may be implemented as an LSI such as a CCD driver.

The signal processing section 400 includes an image signal generating section 15 which generates an image signal by processing the signal supplied from the image capturing section 300, a memory 30 which stores various kinds of data that have been produced while the image signal is being generated, and an image signal output section 16 which sends out the image signal thus generated to an external device. The image signal generating section 15 is suitably combination of a hardware component such as a known digital signal processor (DSP) and a software program for use to perform image processing involving the image signal generation. The memory 30 may be a DRAM, for example. And the memory 30 not only stores the signal supplied from the image capturing section 300 but also temporarily retains the image data that has been generated by the image signal generating section 15 or compressed image data. These image data are then output to either a storage medium or a display section (neither is shown) by way of the image signal output section 16.

The image capture device of this embodiment actually further includes an electronic shutter, a viewfinder, a power supply (or battery), a flashlight and other known components. However, description thereof will be omitted herein because none of them are essential components that would make it difficult to understand how this embodiment works unless they were described in detail. It should also be noted that this configuration is just an example. Rather, this embodiment may also be carried out as any other appropriate combination of known elements as long as the image sensor 10 and the image signal generating section 15 are included.

Hereinafter, the solid-state image sensor 10 of this embodiment will be described.

Figure 4:
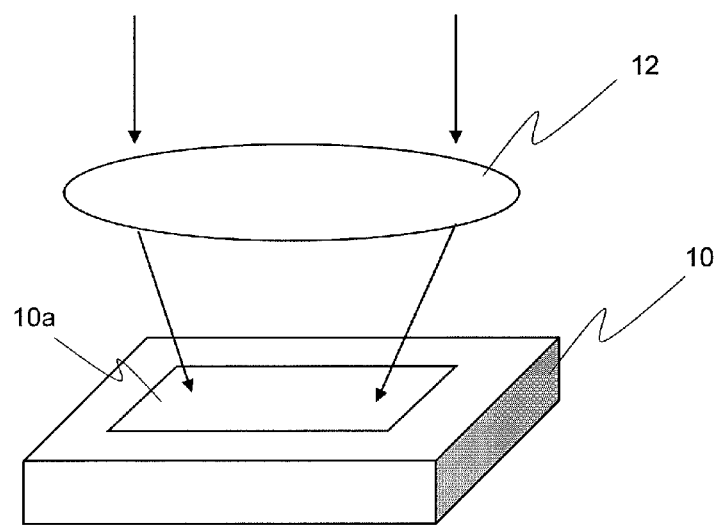
FIG. 4 Illustrates how a lens and an image sensor may be arranged in the first embodiment.

FIG. 4 schematically illustrates how the light that has been transmitted through the lens 12 is incident on the image sensor 10 during an exposure process. In FIG. 4, shown are only the lens 12 and the image sensor 10 with illustration of the other components omitted for the sake of simplicity. Also, although the lens 12 actually often consists of a number of lenses that are arranged in the optical axis direction, the lens 12 shown in FIG. 4 is illustrated as a single lens in a simplified form. On the imaging area 10a of the image sensor 10, arranged two-dimensionally are a number of photosensitive cells (pixels) that form a photosensitive cell array 200. Those photosensitive cells are typically photodiodes, each of which outputs, as a pixel signal, a photoelectrically converted signal representing the quantity of the light received (which will be referred to herein as an "incident light quantity"). The light (visible radiation) that has been transmitted through the lens 12, the optical diaphragm 50 and the optical filter 11 is incident on the imaging area 10a. Generally speaking, the intensity of the light impinging on the imaging area 10a and the distribution of the quantities of incoming light rays that fall within multiple different wavelength ranges (which will be referred to herein as a "split light distribution") vary from one point of incidence to another. Also, the larger the f stop of the optical diaphragm 50, the larger the quantity of obliquely incident light. And the smaller the f stop, the smaller the quantity of obliquely incident light.

Figure 5:
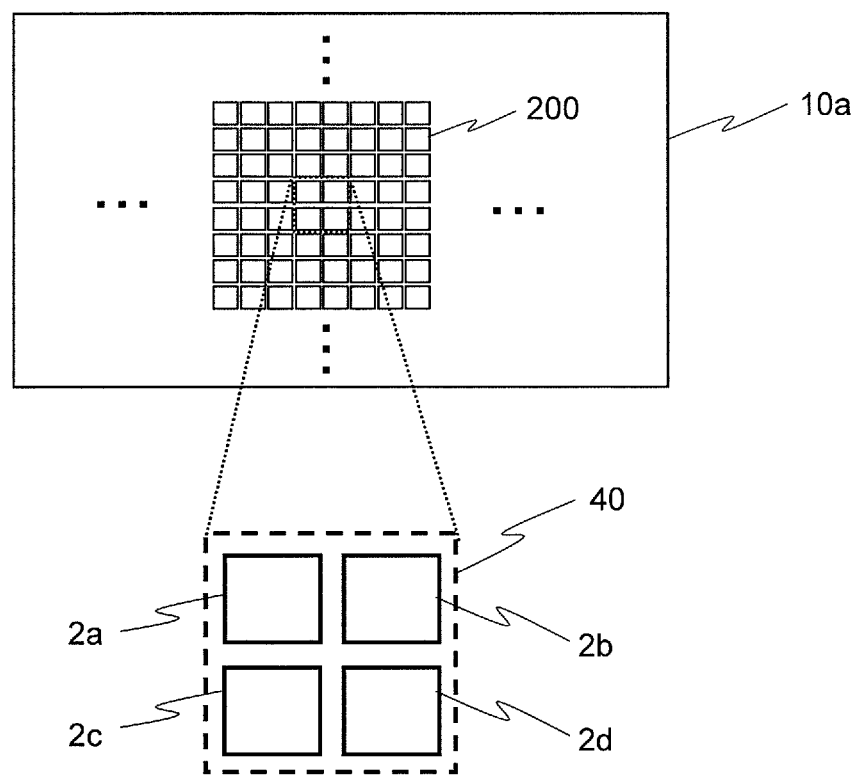
FIG. 5 Illustrates an exemplary pixel arrangement for an image sensor according to the first embodiment.

FIG. 5 is a plan view illustrating an arrangement of pixels according to this embodiment. As shown in FIG. 5, the photosensitive cell array 200 may be made up of a number of photosensitive cells that are arranged on the imaging area 10a to form a tetragonal lattice. The photosensitive cell array 200 is divided into a number of unit blocks 40, each of which consists of four photosensitive cells 2a, 2b, 2c and 2d. Furthermore, in this embodiment, the four photosensitive cells 2a to 2d included in each unit block are arranged close to each other as shown in FIG. 5. However, even if those photosensitive cells 2a to 2d were well spaced from each other, color information could still be obtained by forming appropriately the dispersive element array 100 to be described later. If necessary, each unit block may even have five or more photosensitive cells as well.

The dispersive element array 100 consisting of multiple dispersive elements is arranged on the light incident side so as to face the photosensitive cell array 200. According to this embodiment, one dispersive element is arranged so as to face the four photosensitive cells that are included in each unit block.

Hereinafter, the dispersive elements of this embodiment will be described.

The dispersive element of this embodiment is an optical element which refracts incoming light to multiple different directions according to the wavelength range by utilizing diffraction of the light to produce on the boundary between two different light-transmitting members with mutually different refractive indices. The dispersive element of that type includes high-refractive-index transparent portions (core portions), which are made of a material with a relatively high refractive index, and low-refractive-index transparent portions (clad portions), which are made of a material with a relatively low refractive index and which contact with side surfaces of the core portions. Since the core portion and the clad portion have mutually different refractive indices, a phase difference is caused between the light rays that have been transmitted through the core and clad portions, thus producing diffraction. And since the magnitude of the phase difference varies according to the wavelength of the light, the incoming light can be spatially separated according to the wavelength range into multiple light rays with respective color components. For example, one and the other halves of a light ray with a first color component can be refracted toward first and second directions, respectively, and a light ray with a color component other than the first color component can be refracted toward a third direction. Alternatively, three light rays falling within mutually different wavelength ranges (i.e., having mutually different color components) could be refracted toward three different directions, too. Since the incoming light can be dispersed due to the difference in refractive index between the core and clad portions, the high-refractive-index transparent portion will be sometimes referred to herein as a "dispersive element". Such diffractive dispersive elements are disclosed in Japanese Patent Publication No. 4264465, for example.

A dispersive element array 100, including such dispersive elements, may be fabricated by performing thin-film deposition and patterning processes by known semiconductor device processing technologies. By appropriately determining the material (and refractive index), shape, size and arrangement pattern of the dispersive elements, multiple light rays falling within intended wavelength ranges can be made to be incident on respective photosensitive cells either separately from each other or combined together. As a result, signals representing required color components can be calculated based on a set of photoelectrically converted signals supplied from the respective photosensitive cells.

Hereinafter, it will be described with reference to FIGS. 6A through 6D what the basic structure of the image sensor 10 of this embodiment is like and how the dispersive elements work.

Figure 6A:
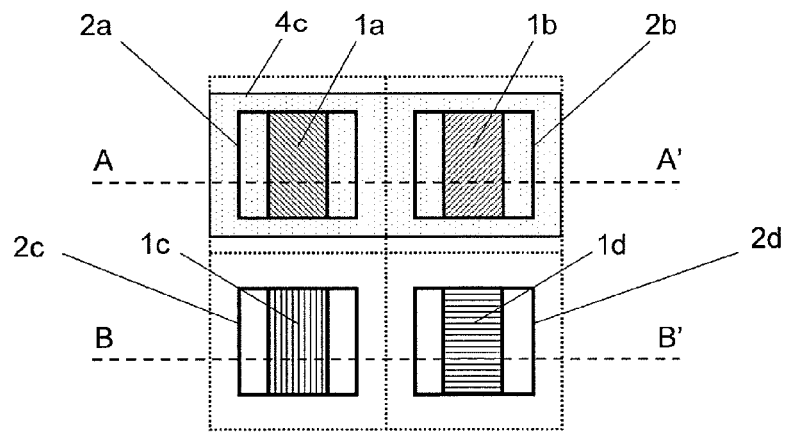
FIG. 6A A plan view illustrating a basic structure for an image sensor according to the first embodiment.

FIG. 6A is a plan view illustrating the basic structure of the image sensor 10. In each unit block, four dispersive elements 1a, 1b, 1c and 1d are arranged so as to face the four photosensitive cells 2a, 2b, 2c and 2d, respectively. A number of basic structures, each having the same arrangement pattern like this, are arranged over the entire imaging area 10a. Also, a micro lenticular lens 4c is arranged every other row vertically over the dispersive element array 100. In FIG. 6A, the micro lenticular lens 4c is arranged over the dispersive elements 1a and 1b, and has a convex surface.

Figure 6B:
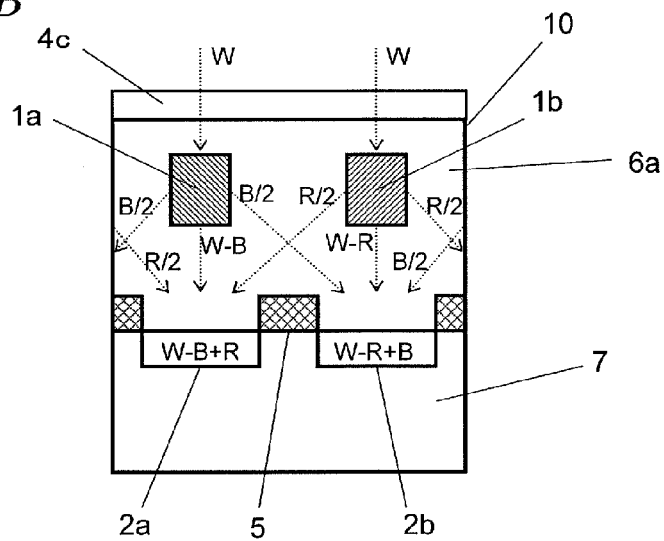
FIG. 6B A cross-sectional view as viewed on the plane A-A' shown in FIG. 6A.
Figure 6C:
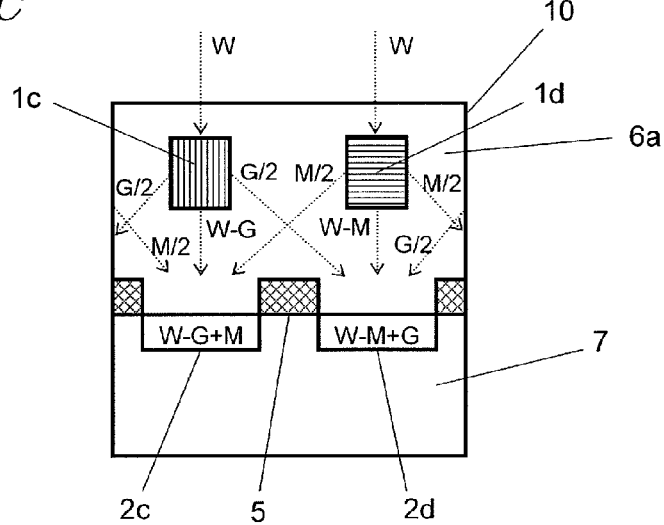
FIG. 6C A cross-sectional view as viewed on the plane B-B' shown in FIG. 6A.

FIGS. 6B and 6C are cross-sectional views of the image sensor 10 shown in FIG. 6A as viewed on the planes A-A' and B-B', respectively. As shown in FIGS. 6B and 6C, the image sensor 10 includes: a semiconductor substrate 7 made of silicon or any other suitable material; photosensitive cells 2a through 2d which are arranged in the semiconductor substrate 7; an interconnect layer 5 and a transparent layer 6a of a low-refractive-index transparent material, which have been stacked in this order on the principal surface of the semiconductor substrate 7 (i.e., on the light incident side); and dispersive elements 1a, 1b, 1c and 1d, which are made of a high-refractive-index transparent material and arranged in the transparent layer 6a.

The structure shown in FIGS. 6A to 6C can be fabricated by known semiconductor device processing. The image sensor 10 shown in FIGS. 6A through 6C has a surface illumination structure in which light is incident on each photosensitive cell through the interconnect layer 5. However, the image sensor 10 of this embodiment does not have to have such a structure but may also have a backside illumination structure in which light is incident on the other side of the device opposite from the interconnect layer 5.

As shown in FIG. 6B, each of the dispersive elements 1a and 1b has a rectangular cross section, which is elongated in the light-transmitting direction, and disperses the incoming light into multiple light rays by taking advantage of a difference in refractive index between itself and the transparent layer 6a. Specifically, the dispersive element 1a makes a yellow (Ye) ray incident on the photosensitive cell 2a that faces the element 1a and also makes one and the other halves of a blue (B) ray incident on the photosensitive cell 2b and on a photosensitive cell (not shown) of an adjacent unit block, respectively. The yellow (Ye) ray is a light ray made up of red (R) and green (G) rays. On the other hand, the dispersive element 1b makes a cyan (Cy) ray incident on the photosensitive cell 2b that faces the element 1b and also makes one and the other halves of an R ray incident on the photosensitive cell 2a and on a photosensitive cell (not shown, either) of another adjacent unit block, respectively. The cyan (Cy) ray is a light ray made up of green (G) and blue (B) rays. According to this embodiment, the dispersive elements 1a and 1b have their length and thickness determined so as to have the light-dispersing property described above. It should be noted that as the R and G rays included in incoming light do not necessarily have the same intensity, the Ye ray is not always a light ray that makes the viewer sense the color yellow that is a mixture of the colors red and green. Likewise, as the G and B rays included in incoming light do not necessarily have the same intensity, the Cy ray is not always a light ray that makes the viewer sense the color cyan that is a mixture of the colors green and blue. For example, if the cell's entering light includes no B rays at all, the Cy ray will be a light ray that makes the viewer sense the color green just like the G ray.

By using such dispersive elements 1a and 1b, the photosensitive cell 2a receives not only a Ye ray (W−B) from the dispersive element 1a but also one and the other halves of an R ray from the dispersive element 1b and a dispersive element of an adjacent unit block, respectively. The photosensitive cell 2b receives not only a Cy ray (W−R) from the dispersive element 1b but also one and the other halves of a B ray from the dispersive element 1a and a dispersive element (not shown) of an adjacent unit block, respectively.

As shown in FIG. 6C, each of the dispersive elements 1c and 1d also has a rectangular cross section, which is elongated in the light-transmitting direction, and disperses the incoming light into multiple light rays by taking advantage of a difference in refractive index between itself and the transparent layer 6a. Specifically, the dispersive element 1c makes a magenta (M) ray incident on the photosensitive cell 2c that faces the element 1c and also makes one and the other halves of a green (G) ray incident on the photosensitive cell 2d and on a photosensitive cell (not shown) of an adjacent unit block, respectively. The magenta (M) ray is a light ray made up of red (R) and blue (B) rays. On the other hand, the dispersive element 1d makes a green (G) ray incident on the photosensitive cell 2d that faces the element 1d and also makes one and the other halves of a magenta ray (M) incident on the photosensitive cell 2c and on a photosensitive cell (not shown, either) of another adjacent unit block, respectively. According to this embodiment, the dispersive elements 1c and 1d have their length and thickness determined so as to have the light-dispersing property described above. It should be noted that as the R and B rays do not necessarily have the same intensity, the magenta ray is not always a light ray that makes the viewer sense the color magenta that is a mixture of the colors red and blue. For example, if the cell's entering light includes no B rays at all, the M ray will be a light ray that makes the viewer sense the color red just like the R ray.

Figure 6D:
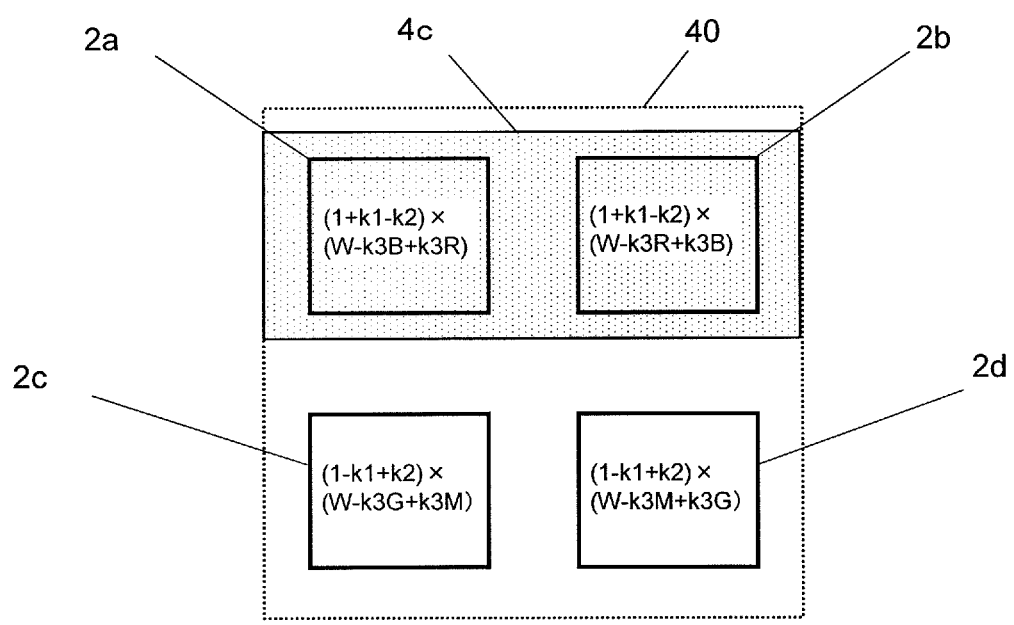
FIG. 6D Shows the intensities of light rays incident on respective photosensitive cells according to the first embodiment.

As the incoming light has been split in this manner by these dispersive elements 1a to 1d, if the influence of the micro lenticular lens 4c and the influence of the obliquely incident light involved with the aperture of the optical diaphragm 50 are ignored, the photosensitive cells 2a to 2d receive light rays, of which the intensities are represented by (W−B+R), (W−R+B), (W−G+M) and (W−M+G), respectively, as shown in FIGS. 6B and 6C. Actually, however, since there are the influence of the micro lenticular lens 4c and the influence of the obliquely incident light involved with the aperture of the optical diaphragm 50, the light rays shown in FIG. 6D are incident on the photosensitive cells 2a through 2d. As described above, k1 is a coefficient to be determined by the optical structure of the micro lenticular lens 4c and k2 and k3 are coefficients to be determined by the influence of the obliquely incident light. Suppose signals representing the intensities of red, green and blue rays are identified by Rs, Gs and Bs, respectively, a signal Cs representing the intensity of a cyan ray is indicated by Gs+Bs, a signal Ys representing the intensity of a yellow ray is indicated by Rs+Gs, a signal Ms representing the intensity of a magenta ray is indicated by Rs+Bs, and a signal Ws representing the intensity of a white ray is indicated by Rs+Gs+Bs. Then, the photosensitive cells 2a through 2d output photoelectrically converted signals S2a to S2d represented by the following Equations (22) to (25), respectively.

$$S2a = (1+k1-k2)(Ws-k3 \cdot Bs+k3 \cdot Rs) \quad (22)$$

$$S2b = (1+k1-k2)(Ws-k3 \cdot Rs+k3 \cdot Bs) \quad (23)$$

$$S2c = (1-k1+k2)(Ws-k3 \cdot Gs+k3 \cdot Ms) \quad (24)$$

$$S2d = (1-k1+k2)(Ws-k3 \cdot Ms+k3 \cdot Gs) \quad (25)$$

Figure 7:
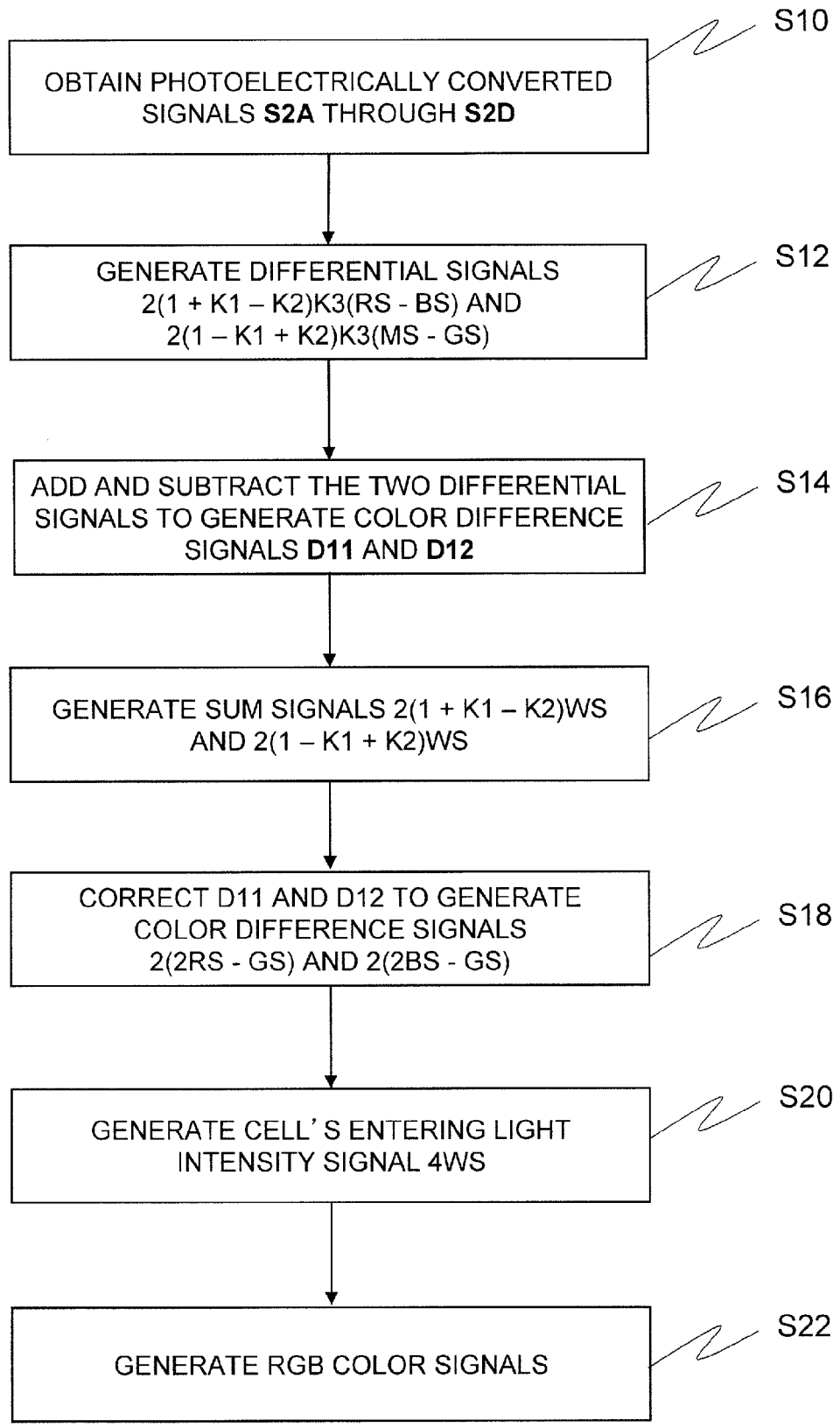
FIG. 7 A flowchart showing the procedure of color information generation processing according to the first embodiment.

These Equations (22) through (25) are obtained when C1s=Bs, C2s=Rs and C3s=Gs are satisfied in Equations (18) through (21). The image signal generating section 15 (see FIG. 3) generates color information by performing arithmetic operations on the photoelectrically converted signals given by these Equations (22) through (25). Hereinafter, it will be described with reference to FIG. 7 how the image signal generating section 15 performs color information generation processing. FIG. 7 is a flowchart showing the procedure of the color information generation processing according to this embodiment.

First of all, in Step S10, the image signal generating section 15 gets the photoelectrically converted signals S2a through S2d. Next, in Step S12, the image signal generates 15 generates signals 2(1+k1−k2)k3(Rs−Bs) and 2(1−k1+k2)k3(Ms−Gs) by calculating (S2a−S2b) and (S2c−S2d), respectively. Subsequently, in Step S14, the image signal generating section 15 adds and subtracts those differential signals to/from each other, thereby generating color difference signals D11 and D12 represented by the following Equations (26) and (27):

$$
\begin{aligned}
D11 &= (S2a - S2b) + (S2c - S2d) \\
&= 2(1 + k1 - k2)k3(Rs - Bs) + \\
&\quad 2(1 - k1 + k2)k3(Ms - Gs) \\
&= 2k3\{(2Rs - Gs) - (k1 - k2)(2Bs - Gs)\}
\end{aligned}
\quad (26)
$$

$$
\begin{aligned}
D12 &= (S2c - S2d) - (S2a - S2b) \\
&= 2(1 - k1 + k2)k3(Ms - Gs) - \\
&\quad 2(1 + k1 - k2)k3(Rs - Bs) \\
&= 2k3\{(2Bs - Gs) - (k1 - k2)(2Rs - Gs)\}
\end{aligned}
\quad (27)
$$

Thereafter, in Step S16, the image signal generating section 15 adds S2a and S2b together and also adds S2c and S2d together, thereby generating sum signals 2(1+k1−k2)Ws and 2(1−k1+k2)Ws given by the following Equations (28) and (29), respectively:

$$S2a+S2b = 2(1+k1-k2)Ws \quad (28)$$

$$S2c+S2d = 2(1-k1+k2)Ws \quad (29)$$

Next, in Step S18, the image signal generating section 15 corrects the color difference signals D11 and D12 based on k1, the difference between the two sum signals calculated by Equations (28) and (29), and the correlation between k2 and k3 that has been obtained in advance as data, thereby generating color difference signals 2(2Rs−Gs) and 2(2Bs−Gs). In this case, the coefficient k1 and the database or function representing the correlation between the coefficients k2 and k3 are stored in advance on a storage medium such as the memory 30.

Subsequently, in Step S20, the image signal generating section 15 adds the pixel signals S2a through S2d together, thereby generating a signal 4(Rs+Gs+Bs)=4Ws representing the intensity of the cell's entering light and using it as a luminance signal. Finally, in Step S22, the image signal generating section 15 performs a matrix operation on the two color difference signals and the one luminance signal, thereby obtaining RGB color signals (i.e., Rs, Gs and Bs).

By performing these signal arithmetic operations on each unit block 40 of the photosensitive cell array 200, the image signal generating section 15 generates signals representing images with the respective color components R, and B (which will be referred to herein as "color image signals"). The color image signals thus generated are output by the image signal output section 16 to a storage medium or display section (not shown). In this case, as the ratio and direction of the obliquely incident light change according to the location of the unit block 40 on the imaging area, the values of the coefficients k1, k2 and k3 may be changed from one unit block 40 to another. By setting these coefficients to be appropriate values according to the location of the unit block 40, the color reproducibility can be further improved.

As described above, the image capture device of this embodiment obtains color image signals by performing addition and subtraction processing using the photoelectrically converted signals S2a through Std and color signal correction processing using k1, k2 and k3. The image sensor 10 of this embodiment does not use any optical element that absorbs light, and therefore, can cut down the loss of light significantly compared to a conventional technique that uses color filters. In addition, even if obliquely incident light is produced by an optical diaphragm, for example, good color reproducibility is still realized.

As described above, in the image sensor 10 of this embodiment, a dispersive element array 100 which includes a number of unit matrices, each consisting of four elements that are arranged in two columns and two rows, is arranged to face a photosensitive cell array 200. Over the dispersive element array 100, arranged is a micro lenticular lens 4c which condenses incoming light vertically every other row. In the dispersive element array 100, a dispersive element 1a that disperses incoming light into a blue ray and non-blue rays is arranged at the row 1, column 1 position. A dispersive element 1b that disperses the incoming light into a red ray and non-red rays is arranged at the row 1, column 2 position. A dispersive element 1c that disperses the incoming light into a green ray and non-green rays is arranged at the row 2, column 1 position. And a dispersive element 1d that disperses the incoming light into a magenta ray (i.e., non-green rays) and a non-magenta ray (i.e., a green ray) is arranged at the row 2, column 2 position. A number of such unit matrices of dispersive elements are arranged to form a repetitive pattern on the imaging area. That is why even if a combination of unit blocks 40 to choose from the photosensitive cell array 200 is changed on a row-by-row or column-by-column basis, the four photoelectrically converted signals to be obtained will always be the same combination of four signals that are represented by Equations (22) through (25), respectively. That is to say, by performing the signal arithmetic operations described above with the target pixel blocks shifted either row by row or column by column, information about the RGB color components can be obtained from almost every single one of those pixels. This means that the resolution of the image capture device can be raised to approximately as high as the actual number of pixels. Consequently, the image capture device of this embodiment not only has higher sensitivity, but also can generate a color image with a higher resolution, than conventional image capture devices. Furthermore, by correcting the color signals using the known coefficient k1, the coefficient k2 obtained through signal processing and the coefficient k3 obtained from k2 based on the correlation between k2 and k3 that has been defined in advance via experiments, the influence of the crosstalk produced by the obliquely incident light can also be eliminated.

It should be noted that the image signal generating section 15 does not always have to generate all of the three image signals representing the three color components. Alternatively, the image signal generating section 15 may also be configured to generate image signal(s) representing only one or two color components depending on the intended application. Also, if necessary, the signals may be amplified, synthesized or corrected as well during the signal processing.

Ideally, the light-dispersing performance of the respective dispersive elements is exactly as described above. However, their light-dispersing performances could be somewhat different from the ideal one. That is to say, the photoelectrically converted signals that are actually output from those photosensitive cells could be different to certain degree from what is defined by Equations (22) to (25). Even if the light-dispersing performances of the respective dispersive elements are slightly different from the ideal ones, good color information can still be obtained by correcting the signals according to the magnitude of the difference.

Optionally, the signal arithmetic operations performed by the image signal generating section 15 of this embodiment may be performed by another device, not the image capture device itself. For example, the color information can also be generated by getting a program defining the signal arithmetic processing of this embodiment executed by an external device that has been provided with the photoelectrically converted signals by the image sensor 10. In that case, the image capture device does not have to include the image signal generating section 15 which performs the arithmetic processing described above.

The basic structure of the image sensor 10 is not limited to the one illustrated in FIGS. 6A through 6C. For example, even if the dispersive elements 1a and 1b are changed with each other or if the dispersive elements 1c and 1d are changed with each other, the effect of this embodiment can also be achieved. Furthermore, the arrangements for the first and second rows shown in FIG. 6A may be changed with each other. Or the dispersive elements 1a and 1b and the dispersive elements 1c and 1d may also be arranged side by side in the column direction, instead of the row direction. In that case, the micro lenticular lens 4c may be arranged so as to run in the column direction. In the embodiment described above, the micro lenticular lens 4c is supposed to be a cylindrical lens, of which the curvature is changed at its interface. However, this is just an example, too. Alternatively, the micro lenticular lens 4c may also use a diffraction effect or may be any other optical element as long as it has such an optical function as to condense incoming light vertically. In this description, such an optical element will be referred to herein as a "condensing element".

Optionally, the light-dispersing properties of the dispersive elements 1a through 1d may be different from the properties shown in FIGS. 6A through 6C. For example, instead of making one and the other halves of a light ray with a certain color component incident on two photosensitive cells on both sides, each of the dispersive elements 1a through 1d may make a light ray with that color component incident on only an adjacent photosensitive cell on one side. Furthermore, the colors of the light rays to which the incoming light is dispersed by the dispersive elements 1a through 1d do not have to be the ones described above. Rather as long as the dispersive element array 100 is configured so that the split light rays received by the photosensitive cells 2a through 2d have different distributions, color image can also be obtained by performing signal processing according to that configuration.

In the foregoing description, an optical element that disperses incoming light into two by taking advantage of a difference in refractive index between two members is used as the dispersive element. However, a dispersive element according to an embodiment of the present disclosure may be anything else as long as it can make a light ray with an intended color component incident on each photosensitive cell. For example, a micro prism may also be used as the dispersive element. Furthermore, multiple different kinds of dispersive elements may also be used in combination as well.

Embodiment 2

Next, a second embodiment will be described with reference to FIGS. 8A through 8C. In an image capture device according to this embodiment, its image sensor 10 has dispersive elements with a different configuration, and performs signal processing in a different way, from in the image capture device of the first embodiment. But other than that, quite the same members are used in both of the first and second embodiments. That is why the following description of this second embodiment will be focused on only the differences from the image capture device of the first embodiment, and their common features will not be described all over again to avoid redundancies.

Figure 8A:
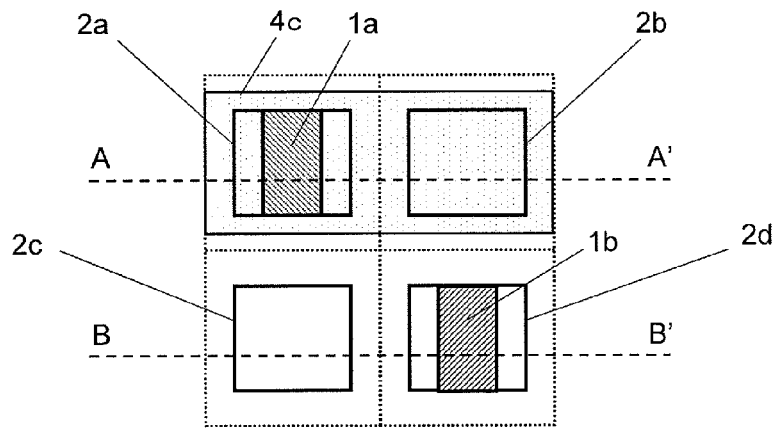
FIG. 8A A plan view illustrating a basic structure for an image sensor according to a second embodiment.
Figure 8B:
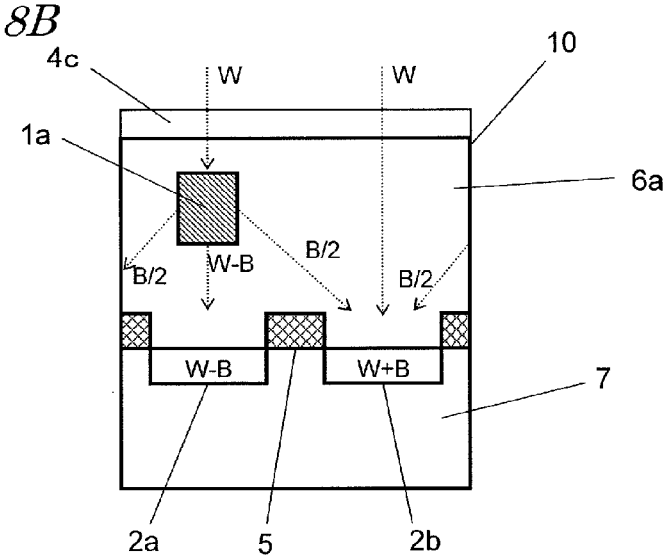
FIG. 8B A cross-sectional view as viewed on the plane A-A' shown in FIG. 8A.
Figure 8C:
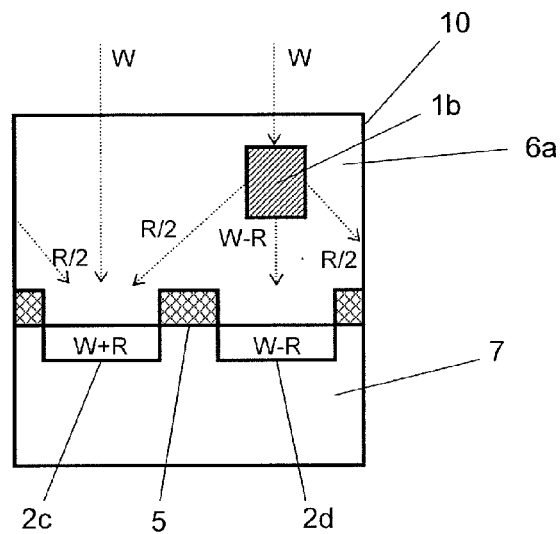
FIG. 8C A cross-sectional view as viewed on the plane B-B' shown in FIG. 8A.

FIG. 8A illustrates a basic configuration for an image sensor 10 according to this embodiment. FIGS. 8B and 8C are cross-sectional views as respectively viewed on the planes A-A' and B-B' shown in FIG. 8A. The dispersive elements of the image sensor 10 of this embodiment are configured as shown in FIGS. 8A through 8C. Specifically, in the dispersive element array 100, a dispersive element 1a that disperses incoming light into a blue ray and non-blue rays is arranged at the row 1, column 1 position and a dispersive element 1b that disperses the incoming light into a red ray and non-red rays is arranged at the row 2, column 2 position. However, no dispersive elements are arranged at the row 1, column 2 and row 2, column 1 positions. As a result, if the influence of the micro lenticular lens 4c and obliquely incident light is not taken into account, light rays, of which the intensities are represented by (W−B), (W+B), (W+R) and (W−R), are incident on the photosensitive cells 2a through 2d, respectively, as shown in FIGS. 8B and 8C.

Figure 8D:
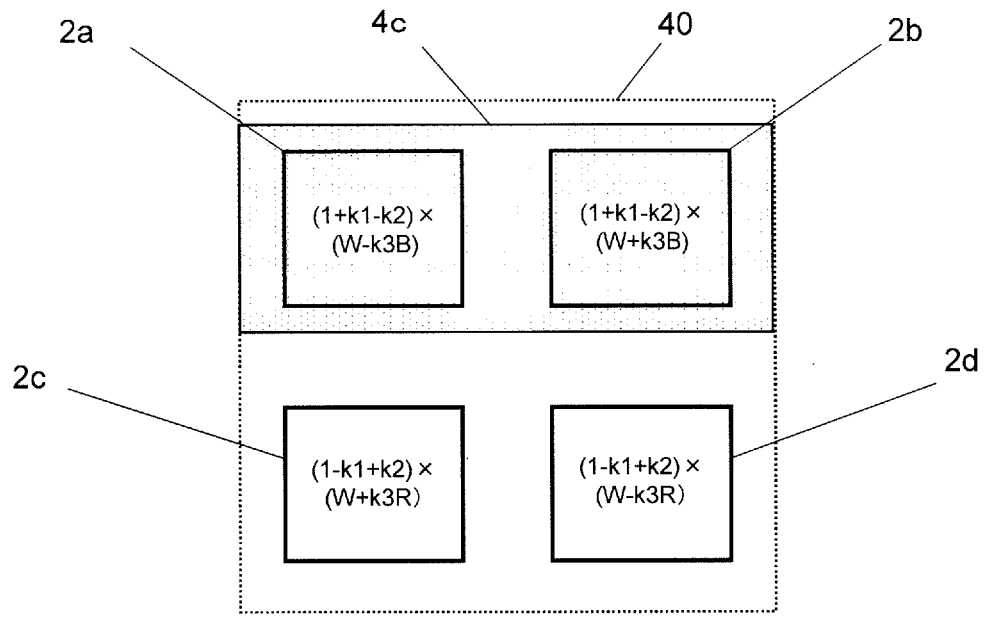
FIG. 8D Shows the intensities of light rays incident on respective photosensitive cells according to the second embodiment.

Actually, however, there is the influence of the micro lenticular lens 4c and such obliquely incident light, and therefore, the light rays shown in FIG. 8D are incident on the photosensitive cells 2a through 2d. As a result, the signals S2a, S2b, S2c and S2d of the respective photosensitive cells are represented by the following Equations (30) through (33) using the coefficients k1, k2 and k3:

$$S2a = (1+k1-k2)(Ws-k3 \cdot Bs) \quad (30)$$

$$S2b = (1+k1-k2)(Ws+k3 \cdot Bs) \quad (31)$$

$$S2c = (1-k1+k2)(Ws+k3 \cdot Rs) \quad (32)$$

$$S2d = (1-k1+k2)(Ws-k3 \cdot Rs) \quad (33)$$

In this case, the image signal generating section 15 generates an R-based color signal 2k3(1−k1+k2)Rs and a B-based color signal 2k3(1+k1−k2)Bs based on the differential signals S2c−S2d and S2b−S2a, respectively, as in the following Equations (34) and (35):

$$S2c-S2d=2k3(1-k1+k2)Rs \quad (34)$$

$$S2b-S2a=2k3(1+k1-k2)Bs \quad (35)$$

Next, the image signal generating section 15 generates sum signals S2c+S2d and S2b+S2a by the following Equations (36) and (37), respectively:

$$S2c+S2d=2(1-k1+k2)Ws \quad (36)$$

$$S2b+S2a=2(1+k1-k2)Ws \quad (37)$$

The image signal generating section 15 calculates the coefficient k2 based on k1 already known and Equations (36) and (37), obtains k3 based on the correlation between k2 and k3 that has been measured in advance, and then calculates Rs and Bs by Equations (34) and (35). Also, the image signal generating section 15 obtains a signal S2a+S2b+S2c+S2d=4Ws as a luminance signal by adding together the signals of the four pixels. After having obtained 4Ws, the image signal generating section 15 obtains Gs by performing the arithmetic operation (4Ws/4)−Rs−Bs.

As can be seen, by performing addition and subtraction processing on the photoelectrically converted signals S2a through S2d and color signal correction processing using k1, k2 and k3, the image capture device of this embodiment can obtain color image signals. As a result, the influence of obliquely incident light can be eliminated, and therefore, an image can be captured with better color reproducibility than in the related art.

In the embodiment described above, the dispersive elements 1a and 1b are arranged so as to face the photosensitive cells 2a and 2d, respectively. However, the dispersive elements 1a and 1b may also be arranged so as to face the photosensitive cells 2b and 2c, respectively. Alternatively, each of those dispersive elements may also be configured to split the incoming light vertically, not horizontally. In that case, the micro lenticular lens 2b may be arranged so as to run vertically. The same statement as what has just been made for this embodiment also applies to the modified example that has been described for the first embodiment.

In the first and second embodiments described above, each dispersive element is arranged to face any photosensitive cell. However, some dispersive element may also be arranged so as to be located over the boundary between multiple photosensitive cells. For example, a first dispersive element that disperses incoming light horizontally may be arranged over the boundary between the photosensitive cells 2a and 2b, and a second dispersive element that disperses incoming light horizontally may be arranged over the boundary between the photosensitive cells 2c and 2d. Even with such a configuration adopted, as long as the first and second dispersive elements have different light-dispersing properties and as long as the image sensor is configured so that light rays with different split light distributions are eventually incident on the photosensitive cells 2a through 2d, color information can also be generated through signal processing.

Figure 9:
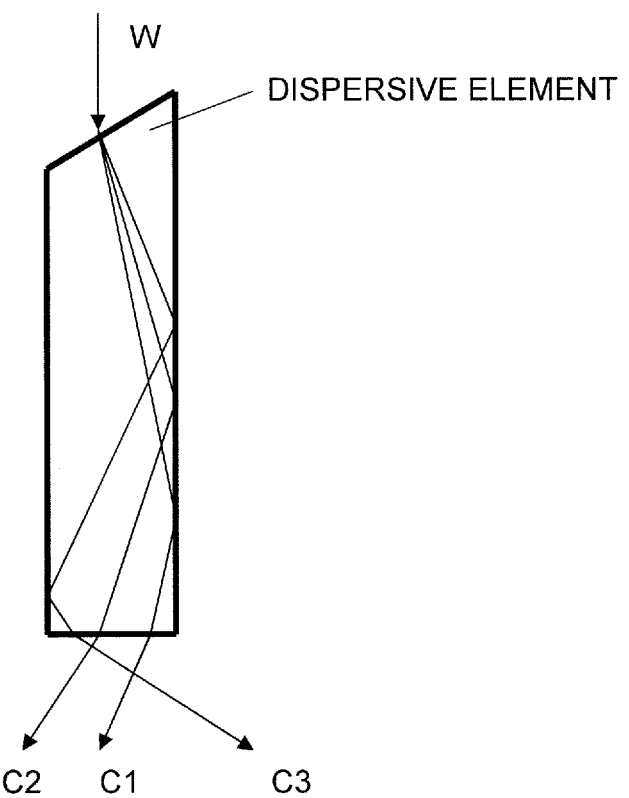
FIG. 9 Illustrates another exemplary dispersive element.
Figure 10:
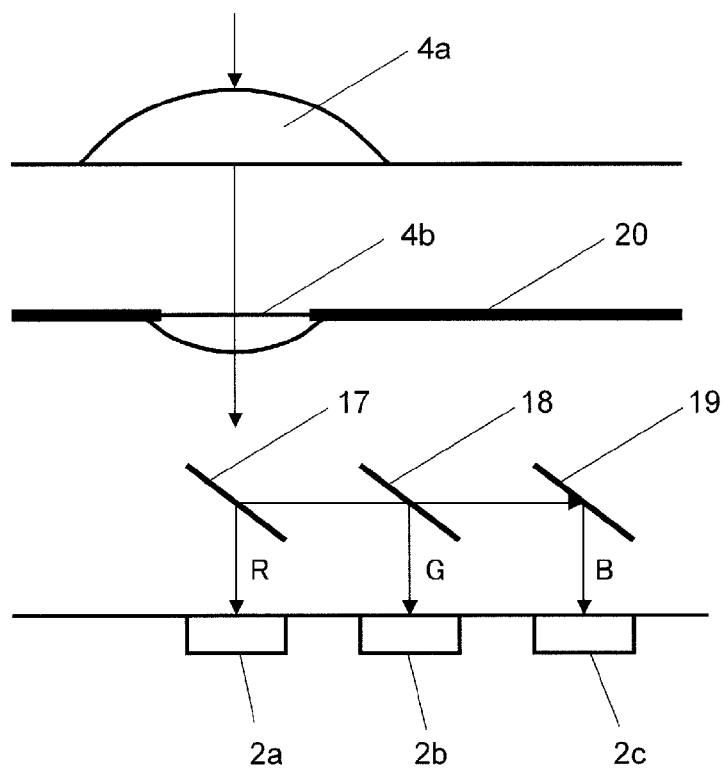
FIG. 10 A cross-sectional view illustrating a conventional image sensor that uses micro lenses and multilayer filters (dichroic mirrors).
Figure 11:
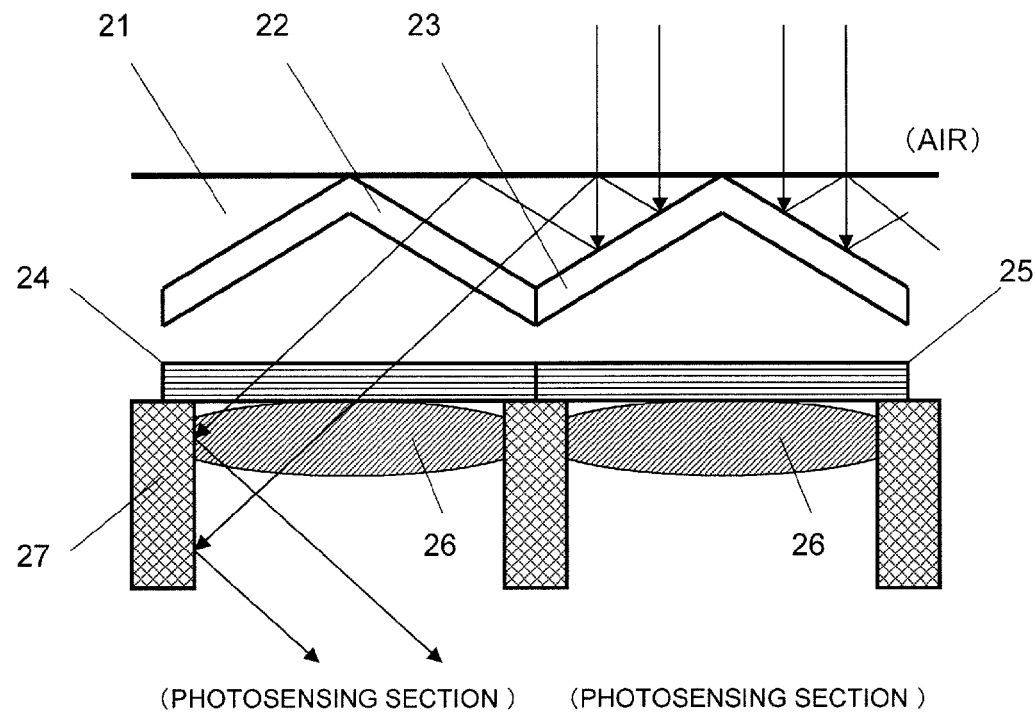
FIG. 11 A cross-sectional view of another conventional image sensor that uses reflection by multilayer filters (dichroic mirrors).

Optionally, each dispersive element does not have to have the property of dispersing incoming light into light rays representing the primary colors (R, G, B) and light rays representing their complementary colors (Cy, Mg, Ye) but may also have the property of dispersing incoming light into light rays falling within three different wavelength ranges. For example, just like the micro prism shown in FIG. 9, a dispersive element which disperses incoming light into light rays with three components C1, C2 and C3 and which makes C1, C2 and C3 rays incident on a photosensitive cell that faces itself, one adjacent photosensitive cell, and the other adjacent photosensitive cell, respectively, may also be used.

INDUSTRIAL APPLICABILITY

A solid-state image sensor and image capture device according to the present disclosure can be used effectively in every camera that ever uses a solid-state image sensor, and may be used in digital still cameras, digital camcorders and other consumer electronic cameras and in industrial surveillance cameras, to name just a few.

REFERENCE SIGNS LIST 1a, 1b, 1c, 1d dispersive element
2, 2a, 2b, 2c, 2d image sensor's photosensitive cell
4a, 4b micro lens
4c micro lenticular lens
5 image sensor's interconnect layer
6a, 6b transparent layer
7 silicon substrate
9 supporting base
10 image sensor
11 optical filter
12 optical lens
13 signal generating and receiving section
14 sensor driving section
15 image signal generating section
16 image signal output section
17 multilayer filter (dichroic mirror) that reflects every ray but red (R) ray
18 multilayer filter (dichroic mirror) that reflects only green (G) ray
19 multilayer filter (dichroic mirror) that reflects only blue (B) ray
20 opaque portion
21 light-transmitting resin
22 multilayer filter (dichroic mirror) that transmits G ray
23 multilayer filter (dichroic mirror) that transmits R ray
24 organic dye filter that transmits G ray
25 organic dye filter that transmits R ray
26 micro lens
27 metal layer
30 memory
40 unit block of photosensitive cells
50 optical diaphragm
100 dispersive element array
200 photosensitive cell array
300 image capturing section
400 signal processing section

The invention claimed is:
1. A solid-state image sensor comprising:
a photosensitive cell array in which a plurality of unit blocks, each including first, second, third and fourth photosensitive cells that are arranged in two rows and two columns, are arranged two-dimensionally on an imaging area, wherein in each said unit block, the first, second, third and fourth photosensitive cells are arranged at row 1, column 1 position, row 2, column 1 position, row 1, column 2 position, and row 2, column 2 position, respectively;
a dispersive element array including a first dispersive element and a second dispersive element which has a dif- ferent light-dispersing property from the first dispersive element, the first dispersive element being arranged to face at least partially at least one of the first and third photosensitive cells and to split incoming light according to its wavelength in a direction in which the first and third photosensitive cells are arranged, the second dispersive element being arranged to face at least partially at least one of the second and fourth photosensitive cells and to split incoming light according to its wavelength in a direction in which the second and fourth photosensitive cells are arranged; and a plurality of condensing elements, each of which is arranged in an area that covers the first and third photosensitive cells and which is configured to condense light onto the first and third photosensitive cells.

2. The solid-state image sensor of claim 1, wherein the first dispersive element is arranged to face the first or third photosensitive cell and to make light rays falling within mutually different wavelength ranges incident on the first and third photosensitive cells, respectively, and wherein the second dispersive element is arranged to face the second or fourth photosensitive cell and to make light rays falling within mutually different wavelength ranges incident on the second and fourth photosensitive cells, respectively.

3. The solid-state image sensor of claim 2, wherein the first dispersive element makes a light ray falling within a first wavelength range incident on the third photosensitive cell and also makes a complementary color ray of the light ray falling within the first wavelength range incident on the first photosensitive cell, and wherein the second dispersive element makes a light ray falling within a second wavelength range incident on the second photosensitive cell and also makes a complementary color ray of the light ray falling within the second wavelength range incident on the fourth photosensitive cell.

4. The solid-state image sensor of claim 1, wherein the dispersive element array further includes third and fourth dispersive elements, and wherein the first through fourth dispersive elements are arranged to face the first through fourth photosensitive cells, respectively, and configured to make light rays falling within mutually different wavelength ranges incident on the first through fourth photosensitive cells, respectively.

5. The solid-state image sensor of claim 4, wherein the first through fourth dispersive elements have either the property of separating incoming light into a primary color ray and a complementary color ray or the property of dispersing incoming light into light rays falling within three different wavelength ranges.

6. The solid-state image sensor of claim 4, wherein the first dispersive element makes a light ray falling within a first wavelength range incident on the third photosensitive cell and also makes a complementary color ray of the light ray falling within the first wavelength range incident on the first photosensitive cell, and wherein the third dispersive element makes a light ray falling within a second wavelength range incident on the first photosensitive cell and also makes a complementary color ray of the light ray falling within the second wavelength range incident on the third photosensitive cell.

7. The solid-state image sensor of claim 4, wherein the first dispersive element makes a light ray falling within a first wavelength range incident on the first photosensitive cell and also makes a complementary color ray of the light ray falling within the first wavelength range incident on the third photosensitive cell, and wherein the third dispersive element makes a light ray falling within the first wavelength range incident on the first photosensitive cell and also makes a complementary color ray of the light ray falling within the first wavelength range incident on the third photosensitive cell.

8. The solid-state image sensor of claim 5, wherein the second dispersive element makes a light ray falling within a third wavelength range incident on the fourth photosensitive cell and also makes a complementary color ray of the light ray falling within the third wavelength range incident on the second photosensitive cell, and wherein the fourth dispersive element makes a light ray falling within the third wavelength range incident on the fourth photosensitive cell and also makes a complementary color ray of the light ray falling within the third wavelength range incident on the second photosensitive cell.

9. The solid-state image sensor of claim 8, wherein the first, second and third wavelength ranges are respectively one, another and the other of the colors red, green and blue wavelength ranges.

10. The solid-state image sensor of claim 1, wherein each of the plurality of condensing elements is a cylindrical lens that has a curved surface on its light incident side.

11. An image capture device comprising:

the solid-state image sensor of claim 1;

an optical system which produces an image on the imaging area of the solid-state image sensor; and a signal processing section which generates color signals based on first through fourth photoelectrically converted signals supplied from the first through fourth photosensitive cells, respectively.

12. The image capture device of claim 11, wherein the signal processing section generates a first luminance signal by performing processing including adding together respective output signals of the first and third photosensitive cells, generates a second luminance signal by performing processing including adding together respective output signals of the second and fourth photosensitive cells, and corrects the color signals based on the difference between the first and second luminance signals.

13. The image capture device of claim 12, further comprising a storage medium on which stored is information about a correlation between a coefficient k1 defining a light condensing property of the condensing element, a correction coefficient k2 indicating the rate of decrease in the coefficient k1 due to influence of light obliquely incident on the solid-state image sensor, and a coefficient k3 indicating the degree of deterioration in the light-dispersing property of the first and second dispersive elements due to the influence of the obliquely incident light.

14. The image capture device of claim 13, wherein the signal processing section corrects the color signals based on the difference between the first and second luminance signals, the coefficient k1, and the information about the correlation.

15. The image capture device of claim 12, wherein the signal processing section generates first and second color difference signals by performing signal arithmetic operations on a first differential signal representing the difference between the first and third photoelectrically converted signals and a second differential signal representing the difference between the second and fourth photoelectrically converted signals and corrects the first and second color difference signals based on the difference between the first and second luminance signals.

* * * * *